United States Patent
Fujii et al.

(10) Patent No.: US 9,917,109 B2
(45) Date of Patent: Mar. 13, 2018

(54) SEMICONDUCTOR DEVICE

(75) Inventors: Teruyuki Fujii, Kanagawa (JP); Ryota Imahayashi, Fukuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 285 days.

(21) Appl. No.: 13/039,450

(22) Filed: Mar. 3, 2011

(65) Prior Publication Data

US 2011/0220891 A1 Sep. 15, 2011

(30) Foreign Application Priority Data

Mar. 12, 2010 (JP) .................... 2010-056758

(51) Int. Cl.
*H01L 29/10* (2006.01)
*H01L 27/12* (2006.01)

(52) U.S. Cl.
CPC ........ *H01L 27/1225* (2013.01); *H01L 27/124* (2013.01)

(58) Field of Classification Search
CPC .................. H01L 27/1214; H01L 27/1225
USPC .......... 438/152, 161; 257/43, 57, 66–68, 71, 257/152, 161, E21.412, E29.289
See application file for complete search history.

(56) References Cited

U.S. PATENT DOCUMENTS

| | | |
|---|---|---|
| 4,918,504 A | 4/1990 | Kato et al. |
| 5,198,377 A | 3/1993 | Kato et al. |
| 5,731,856 A | 3/1998 | Kim et al. |
| 5,744,864 A | 4/1998 | Cillessen et al. |
| 6,107,639 A | 8/2000 | Yamazaki et al. |

(Continued)

FOREIGN PATENT DOCUMENTS

| | | |
|---|---|---|
| CN | 101339899 A | 1/2009 |
| CN | 101645423 A | 2/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters ), Sep. 27, 2004, vol. 85, No. 13, pp. 2541-2543.

(Continued)

*Primary Examiner* — Hung Vu
(74) *Attorney, Agent, or Firm* — Eric J. Robinson; Robinson Intellectual Property Law Office, P.C.

(57) ABSTRACT

A semiconductor device includes a wiring embedded in an insulating layer, an oxide semiconductor layer over the insulating layer, a source electrode and a drain electrode electrically connected to the oxide semiconductor layer, a gate electrode provided to overlap with the oxide semiconductor layer, and a gate insulating layer provided between the oxide semiconductor layer and the gate electrode. The insulating layer is formed so that part of a top surface of the wiring is exposed. The part of the top surface of the wiring is positioned higher than part of a surface of the insulating layer. The wiring in a region exposed from the insulating layer is electrically connected to the source electrode or the drain electrode. The root-mean-square roughness of a region which is part of the surface of the insulating layer and in contact with the oxide semiconductor layer is 1 nm or less.

17 Claims, 15 Drawing Sheets

(56) References Cited

U.S. PATENT DOCUMENTS

| | | | |
|---|---|---|---|
| 6,127,702 | A | 10/2000 | Yamazaki et al. |
| 6,294,274 | B1 | 9/2001 | Kawazoe et al. |
| 6,294,815 | B1 | 9/2001 | Yamazaki et al. |
| 6,326,249 | B1 | 12/2001 | Yamazaki et al. |
| 6,515,299 | B1 | 2/2003 | Yamazaki et al. |
| 6,563,174 | B2 | 5/2003 | Kawasaki et al. |
| 6,635,929 | B2 | 10/2003 | Yamazaki et al. |
| 6,720,575 | B2 | 4/2004 | Yamazaki et al. |
| 6,727,522 | B1 | 4/2004 | Kawasaki et al. |
| 7,022,590 | B2 | 4/2006 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,202,155 | B2 | 4/2007 | Fukuchi |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,307,007 | B2 | 12/2007 | Yamazaki et al. |
| 7,323,356 | B2 | 1/2008 | Hosono et al. |
| 7,358,183 | B2 | 4/2008 | Fukuchi |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,479,673 | B2* | 1/2009 | Jang et al. ............ 257/278 |
| 7,501,293 | B2 | 3/2009 | Ito et al. |
| 7,674,650 | B2 | 3/2010 | Akimoto et al. |
| 7,678,668 | B2 | 3/2010 | Shimomura et al. |
| 7,696,063 | B2 | 4/2010 | Tsuchiya |
| 7,732,819 | B2 | 6/2010 | Akimoto et al. |
| 7,982,250 | B2 | 7/2011 | Yamazaki et al. |
| 8,232,598 | B2 | 7/2012 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0151276 | A1* | 7/2005 | Jang ............ H01L 27/11 257/427 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0181953 | A1* | 8/2007 | Lyu et al. ............ 257/382 |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0072122 | A1* | 3/2009 | Tada et al. ............ 250/208.1 |
| 2009/0073325 | A1 | 3/2009 | Kuwabara et al. |
| 2009/0078970 | A1 | 3/2009 | Yamazaki et al. |
| 2009/0114910 | A1 | 5/2009 | Chang |
| 2009/0127551 | A1 | 5/2009 | Imai |
| 2009/0134399 | A1 | 5/2009 | Sakakura et al. |
| 2009/0142888 | A1* | 6/2009 | Tsuchiya ............ 438/151 |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0032760 | A1 | 2/2010 | Choi et al. |
| 2010/0059751 | A1 | 3/2010 | Takahashi et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0101334 | A1* | 5/2011 | Yamazaki ............ G11C 11/404 257/43 |
| 2011/0108836 | A1* | 5/2011 | Koyama ............ H01L 27/1225 257/43 |

FOREIGN PATENT DOCUMENTS

| | | |
|---|---|---|
| EP | 0304657 A | 3/1989 |
| EP | 1737044 A | 12/2006 |
| EP | 2061087 A | 5/2009 |
| EP | 2226847 A | 9/2010 |
| JP | 60-198861 A | 10/1985 |
| JP | 61-204976 A | 9/1986 |
| JP | 63-169755 A | 7/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-173646 A | 7/1989 |
| JP | 05-166942 A | 7/1993 |
| JP | 05-251705 A | 9/1993 |
| JP | 08-264794 A | 10/1996 |
| JP | 11-505377 | 5/1999 |
| JP | 2000-031488 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2005-101552 A | 4/2005 |
| JP | 2007-027367 A | 2/2007 |
| JP | 2007-109731 A | 4/2007 |
| JP | 2007-250987 A | 9/2007 |
| JP | 2007-317742 A | 12/2007 |
| JP | 2008-098447 A | 4/2008 |
| JP | 2009-032794 A | 2/2009 |
| JP | 2009-094492 A | 4/2009 |
| JP | 2009-094494 A | 4/2009 |
| JP | 2009-135350 A | 6/2009 |
| JP | 2009-141342 A | 6/2009 |
| JP | 2009-158939 A | 7/2009 |
| JP | 2009-188132 A | 8/2009 |
| JP | 2009-194351 A | 8/2009 |
| JP | 2009-283819 A | 12/2009 |
| JP | 2010-021170 A | 1/2010 |
| KR | 2006-0059920 A | 6/2006 |
| KR | 2009-0050971 A | 5/2009 |
| WO | WO-2004/114391 | 12/2004 |
| WO | WO-2008/139859 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Drive by Indium-Gallium-Zinc Oxide TFT's Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID

(56) References Cited

OTHER PUBLICATIONS

Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M at al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No, 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.
Kim.W et al., "An Experimental High-Density DRAM Cell with a Built-in Gain Stage,", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.
International Search Report (Application No. PCT/JP2011/053616) Dated May 17, 2011.
Written Opinion (Application No. PCT/JP2011/053616) Dated May 17, 2011.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nakamura.M et al., "Syntheses and crystal structures of new homologous compounds, indium iron zinc oxides.(InFeO3(ZnO)m) (m natural number) and related compounds,", Kotai Butsuri (Solid State Physics), 1993, vol. 28, No. 5, pp. 317-327.
Nomura.K et al., "Thin-Film Transistor Fabricated in Single-Crystalline Transparent Oxide Semiconductor,", Science, May 23, 2003, vol. 300, No. 5623, pp. 1269-1272.
Kawamura.T et al., "Low-Voltage Operating Amorphous Oxide TFTs,", IDW '09 : Proceedings of the 16th International Display Workshops, Dec. 9, 2009, pp. 1689-1692.

(56) References Cited

OTHER PUBLICATIONS

Chinese Office Action (Application No. 201180013664.6) Dated Sep. 22, 2014.
Korean Office Action (Application No. 2012-7026572) dated Apr. 26, 2017.

* cited by examiner

SEMICONDUCTOR DEVICE

TECHNICAL FIELD

The technical field of the invention relates to a semiconductor device and a method for manufacturing the semiconductor device. Here, semiconductor devices refer to general elements and devices which function by utilizing semiconductor characteristics.

BACKGROUND ART

There are a wide variety of metal oxides and such metal oxides are used for various applications. Indium oxide is a well-known material and has been used as a material of transparent electrodes needed in liquid crystal display devices or the like.

Some metal oxides have semiconductor characteristics. Examples of such metal oxides having semiconductor characteristics are tungsten oxide, tin oxide, indium oxide, zinc oxide, and the like. A thin film transistor in which a channel formation region is formed using such a metal oxide is already known (e.g., see Patent Documents 1 to 4, Non-Patent Document 1, and the like).

As metal oxides, not only single-component oxides but also multi-component oxides are known. For example, $InGaO_3(ZnO)_m$ (m: natural number) having a homologous series is known as a multi-component oxide semiconductor including In, Ga, and Zn (e.g., see Non-Patent Documents 2 to 4 and the like).

Furthermore, it is confirmed that an oxide semiconductor including such an In—Ga—Zn—O-based oxide is applicable to a channel formation region of a thin film transistor (e.g., see Patent Document 5, Non-Patent Documents 5 and 6, and the like).

In order to achieve high-speed operation or the like of a transistor, the transistor needs to be miniaturized. For example, Patent Document 6 discloses a thin film transistor in which the thickness of a channel layer including an oxide semiconductor is approximately less than 10 nm, and Non-Patent Document 7 discloses a thin film transistor in which the length of a channel including an oxide semiconductor is 2 μm to 100 μm.

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2010-21170

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492
[Non-Patent Document 7] T. Kawamura, H. Uchiyama, S. Saito, H. Wakana, T. Mine, and M. Hatano, "Low-Voltage Operating Amorphous Oxide TFTs", IDW'09, pp. 1689-1692

DISCLOSURE OF INVENTION

In the case where a transistor is miniaturized, a problem of a short-channel effect is caused. The short-channel effect refers to degradation of electric characteristics which becomes obvious with miniaturization of a transistor (a reduction in channel length (L)). The short-channel effect results from the effect of an electric field of a drain on a source. Specific examples of the short-channel effect are a decrease in threshold voltage, an increase in subthreshold swing (S value), an increase in leakage current, and the like. In particular, since threshold voltage of a transistor including an oxide semiconductor cannot be controlled by impurity doping unlike a transistor including silicon, the short-channel effect tends to be caused easily.

In the case where a transistor is miniaturized as described above, a wiring and a semiconductor element such as a transistor are formed in different layers so that a stacked-layer structure is obtained, whereby high integration of a semiconductor device can be achieved by utilizing the miniaturized transistor. However, a problem is caused in that contact resistance is increased in a contact between an electrode of the miniaturized transistor and a wiring or an electrode of a semiconductor element in a different layer, resulting in an increase in the amount of heat generation or power consumption of the transistor.

Therefore, an object of an embodiment of the disclosed invention is to provide a semiconductor device which is miniaturized with favorable characteristics maintained. Another object is to achieve three-dimensional high integration with favorable characteristics of a miniaturized semiconductor device maintained.

An embodiment of the disclosed invention is a semiconductor device including an insulating layer, a wiring embedded in the insulating layer, an oxide semiconductor layer over the insulating layer, a source electrode and a drain electrode electrically connected to the oxide semiconductor layer, a gate electrode provided to overlap with the oxide semiconductor layer, and a gate insulating layer provided between the oxide semiconductor layer and the gate electrode. The insulating layer is formed so that at least part of a top surface of the wiring is exposed. The part of the top surface of the wiring is positioned higher than part of a surface of the insulating layer. The wiring in the region exposed from the insulating layer is electrically connected to the source electrode or the drain electrode. The root-mean-square roughness of a region which is part of the surface of the insulating layer and is in contact with the oxide semiconductor layer is less than or equal to 1 nm.

Note that in this specification and the like, a root-mean-square (RMS) roughness is obtained by three-dimensionally expanding the RMS roughness of a cross section curve so as to apply to a measurement surface. The RMS is expressed as the square root of the average value of squares of deviations from a reference surface to a specific surface, and can be obtained by the following formula.

$$R_{ms} = \sqrt{\frac{1}{S_0} \int_{Y_1}^{Y_2} \int_{X_1}^{X_2} \{F(X, Y) - Z_0\}^2 \, dX \, dY} \quad \text{[Formula 1]}$$

Note that the measurement surface is a surface which is shown by all the measurement data, and is represented by the following formula.

$$Z = F(X, Y) \quad \text{[Formula 2]}$$

The specific surface is a surface which is an object of roughness measurement, and is a rectangular region which is surrounded by four points represented by the coordinates $(X_1, Y_1)$, $(X_1, Y_2)$, $(X_2, Y_1)$, and $(X_2, Y_2)$. The area of the specific surface is represented by $S_0$ when the specific surface is flat ideally. Note that $S_0$ is obtained by the following formula.

$$S_0 = |X_2 - X_1| \cdot |Y_2 - Y_1| \quad \text{[Formula 3]}$$

In addition, the reference surface is a surface parallel to an X-Y plane at the average height of the specific surface. In other words, when the average value of the height of the specific surface is represented by $Z_0$, the height of the reference surface is also represented by $Z_0$. Note that $Z_0$ can be obtained by the following formula.

$$Z_0 = \frac{1}{S_0} \int_{Y_1}^{Y_2} \int_{X_1}^{X_2} F(X, Y) \, dX \, dY \quad \text{[Formula 4]}$$

Note that in this specification and the like, the root-mean-square (RMS) roughness is obtained by calculation conducted on a region of 10 nm×10 nm, preferably a region of 100 nm×100 nm, further preferably a region of 1 μm×1 μm, in an atomic force microscope (AFM) image obtained using an AFM.

Another embodiment of the disclosed invention is a semiconductor device including an insulating layer, a wiring embedded in the insulating layer, an oxide semiconductor layer over the insulating layer, a source electrode and a drain electrode electrically connected to the oxide semiconductor layer, a gate electrode provided to overlap with the oxide semiconductor layer, and a gate insulating layer provided between the oxide semiconductor layer and the gate electrode. The insulating layer is formed so that at least part of a top surface of the wiring is exposed. The part of the top surface of the wiring is positioned higher than part of a surface of the insulating layer. The wiring in the region exposed from the insulating layer is electrically connected to the gate electrode. The root-mean-square roughness of a region which is part of the surface of the insulating layer and is in contact with the oxide semiconductor layer is less than or equal to 1 nm.

Another embodiment of the disclosed invention is a semiconductor device including a first insulating layer; a wiring embedded in the first insulating layer; a second insulating layer over the first insulating layer; a source electrode and a drain electrode embedded in the second insulating layer; an oxide semiconductor layer partly in contact with a surface of the second insulating layer, a surface of the source electrode, and a surface of the drain electrode; a gate insulating layer covering the oxide semiconductor layer; and a gate electrode provided over the gate insulating layer to overlap with the oxide semiconductor layer. The first insulating layer is formed so that at least part of a top surface of the wiring is exposed. The part of the top surface of the wiring is positioned higher than part of a surface of the first insulating layer. The wiring in the region exposed from the first insulating layer is electrically connected to the source electrode or the drain electrode. The root-mean-square roughness of a region which is part of the surface of the second insulating layer and is in contact with the oxide semiconductor layer is less than or equal to 1 nm.

Note that part of a side surface of the wiring may also be exposed.

Another embodiment of the disclosed invention is a semiconductor device including a first transistor, an insulating layer provided over the first transistor, and a second transistor provided over the first transistor with the insulating layer positioned therebetween. The first transistor includes a first channel formation region, a first gate insulating layer provided over the first channel formation region, a first gate electrode provided over the first gate insulating layer to overlap with the first channel formation region, and a first source electrode and a first drain electrode electrically connected to the first channel formation region. The second transistor includes a second channel formation region including an oxide semiconductor layer, a second source electrode and a second drain electrode electrically connected to the second channel formation region, a second gate electrode provided to overlap with the second channel formation region, and a second gate insulating layer provided between the second channel formation region and the second gate electrode. The insulating layer is formed over the first transistor so that at least part of a top surface of the first gate electrode is exposed. The part of the top surface of the first gate electrode is positioned higher than part of a surface of the insulating layer. The first gate electrode in the region exposed from the insulating layer is electrically connected to the second source electrode or the second drain electrode. The root-mean-square roughness of a region which is part of the surface of the insulating layer and is in contact with the second channel formation region is less than or equal to 1 nm.

Another embodiment of the disclosed invention is a semiconductor device including a first transistor, a first insulating layer provided over the first transistor, and a second transistor provided over the first transistor with the first insulating layer positioned therebetween. The first transistor includes a first channel formation region, a first gate insulating layer provided over the first channel formation region, a first gate electrode provided over the first gate insulating layer to overlap with the first channel formation region, and a first source electrode and a first drain electrode electrically connected to the first channel formation region. The second transistor includes a second source electrode and a second drain electrode embedded in a second insulating layer; a second channel formation region which is partly in contact with a surface of the second insulating layer, a surface of the second source electrode, and a surface of the second drain electrode and includes an oxide semiconductor layer; a second gate insulating layer covering the second channel formation region; and a second gate electrode provided over the second gate insulating layer to overlap with the second channel formation region. The first insulating layer is formed over the first transistor so that at least part of a top surface of the first gate electrode is exposed. The part of the top surface of the first gate electrode is positioned higher than part of a surface of the first insulating layer. The first gate electrode in the region exposed from the first insulating layer is electrically connected to the second source electrode or the second drain electrode. The root-mean-square roughness of a region which is part of the surface of the second insulating layer and is in contact with the second channel formation region is less than or equal to 1 nm.

Note that part of a side surface of the first gate electrode may also be exposed. In addition, it is preferable that the first channel formation region and the second channel formation region include different semiconductor materials.

Another embodiment of the disclosed invention is a method for manufacturing a semiconductor device, including the steps of forming a first insulating layer in which a wiring is embedded; performing planarization treatment on a surface of the first insulating layer so that the planarized first insulating layer partly has a surface with a root-mean-square roughness of less than or equal to 1 nm, at least part of a top surface of the wiring is exposed, and the part of the top surface of the wiring is positioned higher than part of the surface of the first insulating layer; forming a source electrode and a drain electrode over the surfaces of the first insulating layer and the wiring so that the source electrode or the drain electrode is electrically connected to the wiring in the region exposed from the first insulating layer; forming a second insulating layer so as to cover the source electrode and the drain electrode; performing planarization treatment on a surface of the second insulating layer so that the planarized second insulating layer partly has a surface with a root-mean-square roughness of less than or equal to 1 nm and at least part of top surfaces of the source electrode and the drain electrode is exposed; forming an oxide semiconductor layer partly in contact with the surface of the planarized second insulating layer, a surface of the source electrode, and a surface of the drain electrode; forming a gate insulating layer covering the oxide semiconductor layer; and forming a gate electrode over the gate insulating layer so as to overlap with the oxide semiconductor layer.

Another embodiment of the disclosed invention is a method for manufacturing a semiconductor device, including the steps of forming a first transistor including a first channel formation region, a first gate insulating layer over the first channel formation region, a first gate electrode which is over the first gate insulating layer and overlaps with the first channel formation region, and a first source electrode and a first drain electrode electrically connected to the first channel formation region; forming a first insulating layer so as to cover the first transistor; performing planarization treatment on a surface of the first insulating layer so that the planarized first insulating layer partly has a surface with a root-mean-square roughness of less than or equal to 1 nm, at least part of a top surface of the first gate electrode is exposed, and the part of the top surface of the first gate electrode is positioned higher than part of the surface of the first insulating layer; forming a second source electrode and a second drain electrode over the surfaces of the first insulating layer and the first gate electrode so that the second source electrode or the second drain electrode is electrically connected to the first gate electrode in the region exposed from the first insulating layer; forming a second insulating layer so as to cover the second source electrode and the second drain electrode; performing planarization treatment on a surface of the second insulating layer so that the planarized second insulating layer partly has a surface with a root-mean-square roughness of less than or equal to 1 nm and at least part of top surfaces of the second source electrode and the second drain electrode is exposed; forming a second channel formation region which is partly in contact with the surface of the planarized second insulating layer, a surface of the second source electrode, and a surface of the second drain electrode and includes an oxide semiconductor layer; forming a second gate insulating layer covering the second channel formation region; and forming a second gate electrode over the second gate insulating layer so as to overlap with the second channel formation region.

Note that the planarization treatment is preferably performed by CMP treatment.

Note that a channel length L of the above transistor is preferably less than 2 μm, further preferably greater than or equal to 10 nm and less than or equal to 350 nm (0.35 μm). In addition, the thickness of the oxide semiconductor layer is greater than or equal to 1 nm and less than or equal to 50 nm, preferably greater than or equal to 2 nm and less than or equal to 20 nm, further preferably greater than or equal to 3 nm and less than or equal to 15 nm. Thus, a semiconductor device with high operation speed and low power consumption is realized. Further, a high dielectric constant material such as hafnium oxide is used for the gate insulating layer. For example, the relative permittivity of hafnium oxide is approximately 15 and the value is significantly large as compared to 3 to 4, which is the relative permittivity of silicon oxide. With the use of such a high dielectric constant material, a gate insulating layer having an equivalent oxide thickness of less than 15 nm, preferably greater than or equal to 2 nm and less than or equal to 10 nm, can be easily realized. That is, the semiconductor device can be easily miniaturized. Furthermore, a purified and intrinsic oxide semiconductor is used for the oxide semiconductor layer. Thus, the carrier density of the oxide semiconductor layer can be lower than $1\times10^{12}/cm^3$, preferably lower than $1.45\times10^{10}/cm^3$; the off-state current of the transistor can be less than or equal to 100 zA/μm (1 zA (zeptoampere) is $1\times10^{-21}$ A), preferably less than or equal to 10 zA/μm; and the S value of the transistor can be less than or equal to 65 mV/dec, preferably less than 63 mV/dec, for example. In the case where any of the above structures is employed, the off-state current of the transistor can be $1\times10^{-24}$ A/μm to $1\times10^{-30}$ A/μm in theory. The gate electrode may overlap with the source electrode and the drain electrode, or only ends of the gate electrode may overlap with an end of the source electrode and an end of the drain electrode.

Here, semiconductor devices refer to general devices which function by utilizing semiconductor characteristics.

For example, a display device, a memory device, an integrated circuit, and the like are included in the category of the semiconductor device.

Note that in this specification and the like, the term "over" or "below" does not necessarily mean that a component is placed "directly on" or "directly under" another component. For example, the expression "a gate electrode over a gate insulating layer" does not exclude the case where a component is placed between the gate insulating layer and the gate electrode.

In addition, in this specification and the like, the term "electrode" or "wiring" does not limit a function of a component. For example, an "electrode" is sometimes used as part of a "wiring", and vice versa. Moreover, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

According to an embodiment of the disclosed invention, a channel formation region of a transistor is provided in an extremely flat region, whereby a problem such as a short-channel effect can be prevented even when the transistor is miniaturized and thus a transistor having favorable characteristics can be provided.

Moreover, according to an embodiment of the disclosed invention, part of a top surface of a wiring or an electrode in a lower layer is formed in a higher position than part of a surface of an insulating layer, whereby a reduction in the area of a portion where the wiring or the electrode in the lower layer is in contact with an electrode of a transistor in an upper layer can be prevented and thus the contact resistance between the wiring or the electrode in the lower layer and the electrode of the transistor in the upper layer can be reduced. Accordingly, the amount of heat generation or power consumption of the transistor in the upper layer which is electrically connected to the wiring or the electrode in the lower layer can be reduced; therefore, the wiring or the electrode in the lower layer and the transistor in the upper layer can be stacked with the amount of heat generation or power consumption of the transistor in the upper layer suppressed. Consequently, by forming a stacked-layer structure with the use of the miniaturized transistor and the wiring or the electrode, three-dimensional high integration of a semiconductor device can be achieved with favorable transistor characteristics maintained.

BEST MODE FOR CARRYING OUT THE INVENTION

Figure 1A:
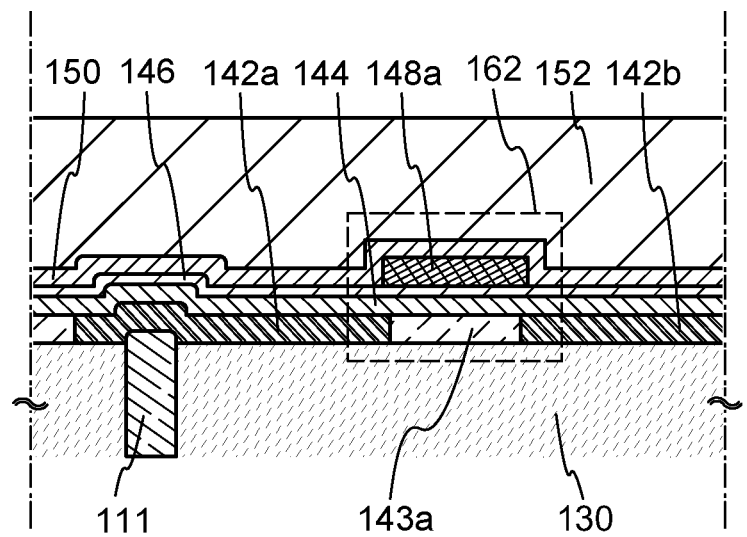
FIGS. 1A and 1B are cross-sectional views illustrating examples of a structure of a semiconductor device.

Examples of embodiments of the present invention will be described below with reference to the drawings. Note that the present invention is not limited to the following description and it will be easily understood by those skilled in the art that modes and details can be modified in various ways without departing from the spirit and the scope of the present invention. Therefore, the present invention is not construed as being limited to the description in the following embodiments.

Note that the position, the size, the range, or the like of each component illustrated in drawings and the like is not accurately represented in some cases for easy understanding. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not limit the components numerically.

Embodiment 1

In this embodiment, a structure and a manufacturing method of a semiconductor device according to an embodiment of the disclosed invention will be described with reference to FIGS. 1A and 1B, FIGS. 2A and 2B, FIGS. 3A to 3E, and FIGS. 4A to 4C.

<Example of Structure of Semiconductor Device>

FIG. 1A illustrates an example of a structure of a semiconductor device including a transistor 162 which is formed over an insulating layer 130 where a wiring 111 is embedded and which is electrically connected to the wiring 111 via a source electrode 142a.

The transistor 162 illustrated in FIG. 1A includes an insulating layer 143a formed over the insulating layer 130 where the wiring 111 is embedded; the source electrode 142a and a drain electrode 142b embedded in an insulating layer including the insulating layer 143a; an oxide semiconductor layer 144 partly in contact with a top surface of the insulating layer 143a, a top surface of the source electrode 142a, and a top surface of the drain electrode 142b; a gate insulating layer 146 covering the oxide semiconductor layer 144; and a gate electrode 148a over the gate insulating layer 146. Further, an insulating layer 150 and an insulating layer 152 may be formed over the transistor 162 so as to cover the gate insulating layer 146, the gate electrode 148a, and the like.

The insulating layer 130 is formed so that at least part of a top surface of the wiring 111 is exposed. The part of the top surface of the wiring 111 is positioned higher than part of a surface of the insulating layer 130, and the wiring 111 in the region exposed from the insulating layer 130 is electrically connected to the source electrode 142a (drain electrode in some cases). Here, the insulating layer 130 and the wiring 111 are formed over a surface where a layer is formed, such as a surface of a substrate or the like, and part of the surface of the insulating layer 130 and the part of the top surface of the wiring 111 have favorable planarity. The root-mean-square (RMS) roughness of the part of the surface of the insulating layer 130 is preferably less than or equal to 1 nm. The root-mean-square (RMS) roughness of the part of the top surface of the wiring 111 is preferably less than or equal to 2 nm. Note that in this specification, the part of the top surface of the wiring 111 refers to a region which is in the top surface of the wiring 111 and parallel to the surface where a layer is formed. In this specification, the part of the surface of the insulating layer 130 refers to a region which is in the surface of the insulating layer 130 and parallel to the surface where a layer is formed.

In addition, the difference in height between the part of the top surface of the wiring 111 and the part of the surface of the insulating layer 130 is preferably 0.1 times to 5 times as large as the thickness of the gate insulating layer 146.

Figure 1B:
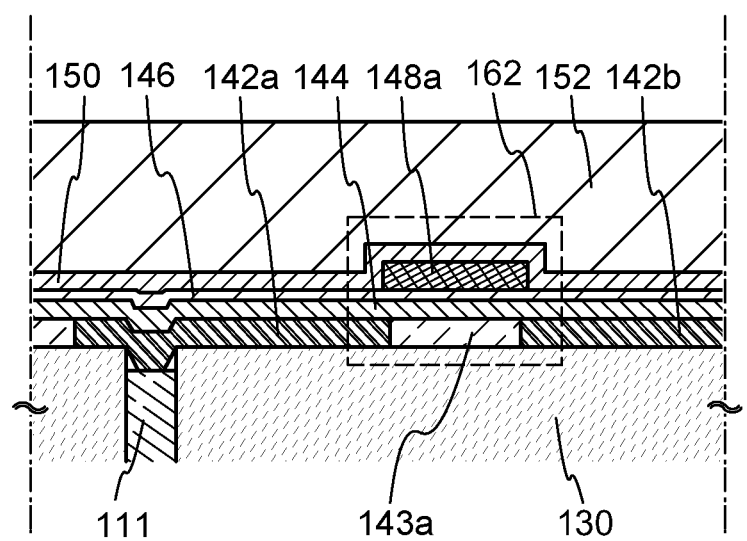

By forming the part of the top surface of the wiring 111 in a higher position than the part of the surface of the insulating layer 130, a reduction in the area of a portion where the wiring 111 is in contact with the source electrode 142a can be prevented. For example, if the part of the top surface of the wiring 111 is formed in a lower position than the part of the surface of the insulating layer 130 as illustrated in FIG. 1B, a region which is in the top surface of the wiring 111 exposed from the insulating layer 130 and is not in contact with the source electrode 142a is easily formed. On the other hand, when the part of the top surface of the wiring 111 is formed in a higher position than the part of the surface of the insulating layer 130 as illustrated in FIG. 1A, the wiring 111 can be in contact with the source electrode 142a in the entire area of the top surface of the wiring 111 exposed from the insulating layer 130. Note that in the case where part of a side surface of the wiring 111 is also exposed from the insulating layer 130, the wiring 111 can also be in contact with the source electrode 142a in the part of the side surface of the wiring 111.

Thus, by forming the part of the top surface of the wiring 111 in a higher position than the part of the surface of the insulating layer 130, a reduction in the area of a portion where the wiring 111 is in contact with the source electrode 142a can be prevented; accordingly, the contact resistance between the wiring 111 and the source electrode 142a can be reduced. Moreover, since the part of the top surface of the wiring 111 has favorable planarity, adhesion between the wiring 111 and the source electrode 142a is favorable and thus the contact resistance can be further reduced. Consequently, the amount of heat generation or power consumption of the transistor 162 whose source electrode 142a is electrically connected to the wiring 111 can be reduced.

Further, when the part of the top surface of the wiring 111 is exposed by CMP treatment or the like, an edge portion of the top surface of the wiring 111 can be polished and the edge portion of the top surface of the wiring 111 can have a smooth shape, preferably a shape having a surface curved smoothly from the surface of the insulating layer 130 to a top end portion of the projecting wiring 111. By providing such a smooth curved surface on the top end portion of the wiring 111 which projects from the insulating layer 130, the wiring 111 and the source electrode 142a can be in close contact with each other without a space therebetween. Accordingly, the contact resistance between the wiring 111 and the source electrode 142a can be further reduced. Furthermore, even when the thickness of the source electrode 142a is reduced, disconnection of the source electrode 142a in an intersection with the wiring 111 can be prevented.

By forming the part of the top surface of the wiring 111 in a higher position than the part of the surface of the insulating layer 130, an interface between the wiring 111 and the source electrode 142a becomes not two-dimensional but three-dimensional; thus, adhesion between the wiring 111 and the source electrode 142a can be improved and the physical strength in attachment of the wiring 111 and the source electrode 142a can be improved.

By using an oxide semiconductor in an active layer of the transistor as illustrated in FIG. 1A, favorable characteristics can be obtained. For example, the S value of the transistor can be less than or equal to 65 mV/dec, preferably less than 63 mV/dec. In addition, as illustrated in FIG. 1A, a cross-sectional shape of a portion corresponding to a channel formation region of the oxide semiconductor layer which is used as the active layer of the transistor is preferably a flat shape.

It is preferable that the root-mean-square (RMS) roughness of a region which is part of the top surface of the insulating layer 143a (the part particularly refers to a region parallel to a surface where a layer is formed) and in contact with the oxide semiconductor layer be less than or equal to 1 nm. It is preferable that the difference in height between an upper end portion of the insulating layer 143a and an upper end portion of the source electrode 142a, which are in contact with each other, or the difference in height between another upper end portion of the insulating layer 143a and an upper end portion of the drain electrode 142b, which are in contact with each other, be less than 5 nm.

As described above, by providing the channel formation region of the transistor 162 in an extremely flat region whose root-mean-square (RMS) roughness is less than or equal to 1 nm, a problem such as a short-channel effect can be prevented even when the transistor 162 is miniaturized and thus the transistor 162 having favorable characteristics can be provided.

Further, by increasing the planarity of the insulating layer 130, variation in the thickness of the oxide semiconductor layer 144 can be reduced and characteristics of the transistor 162 can be improved. Furthermore, degradation of coverage due to a large difference in height can be suppressed and disconnection (wiring disconnection) or a connection defect of the oxide semiconductor layer 144 can be prevented.

Here, the oxide semiconductor layer 144 is preferably a purified oxide semiconductor layer obtained by sufficiently removing impurities such as hydrogen or sufficiently supplying oxygen. Specifically, the hydrogen concentration of the oxide semiconductor layer 144 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$, for example. Note that the hydrogen concentration of the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect levels in the energy gap due to oxygen deficiency are reduced by sufficient supply of oxygen, the density of carriers due to a donor such as hydrogen is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, current per micrometer (μm) of channel width) at room temperature (25° C.) is less than or equal to 100 zA (1 zA (zeptoampere) is $1 \times 10^{-21}$ A), preferably less than or equal to 10 zA. In this manner, by using an i-type (intrinsic) or substantially i-type oxide semiconductor, the transistor 162 which has extremely favorable off-state current characteristics can be obtained. Further, by using the i-type (intrinsic) or substantially i-type oxide semiconductor, a problem of the transistor caused owing to the thickness of the oxide semiconductor layer can be suppressed.

Note that as disclosed in Non-Patent Document 7 or the like, a transistor having a relatively large size of a channel length of 2 μm to 100 μm, for example, can be realized with the use of an n-type oxide semiconductor having a high carrier density of $2 \times 10^{19}$/cm$^3$; however, if such a material is used for a transistor which is miniaturized (to have a channel length of less than 2 μm), the threshold voltage thereof is largely shifted to a minus side and thus it is extremely difficult to realize a normally-off transistor. In other words, a transistor which is manufactured using such a material and has a channel length of less than 2 μm is not suitable for practical use. In contrast, the carrier density of an oxide semiconductor that is purified and made intrinsic or substantially intrinsic is lower than $1 \times 10^{14}$/cm$^3$ at most, and the above-described problem in that the transistor is normally on does not occur; accordingly, a transistor having a channel length of less than 2 μm can be easily realized.

Note that the structure of a semiconductor device according to an embodiment of the disclosed invention is not limited to the structure of the semiconductor device illustrated in FIG. 1A. Although the semiconductor device illustrated in FIG. 1A includes the transistor 162 which is electrically connected to the wiring 111 via the source electrode 142a, a semiconductor device illustrated in FIG. 2A including the transistor 162 whose gate electrode 148a is electrically connected to the wiring 111 may be employed, for example. In the semiconductor device illustrated in FIG. 2A, the same reference numerals are used for portions common to those of the semiconductor device illustrated in FIG. 1A.

Figure 2A:
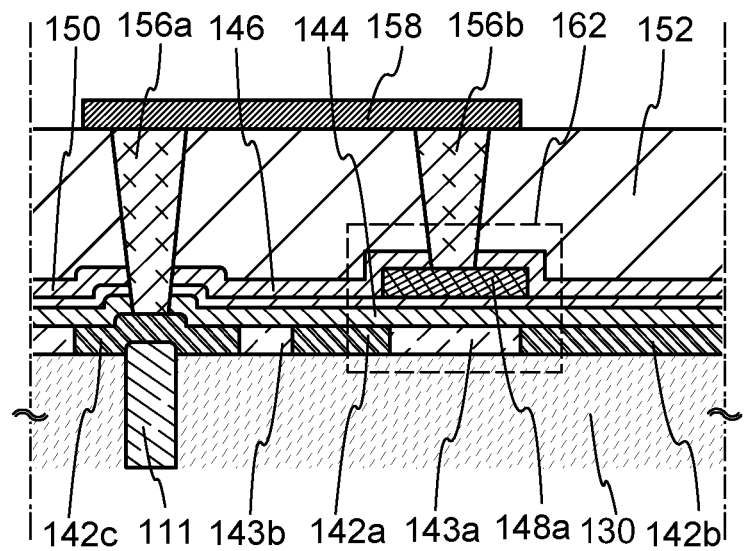
FIGS. 2A and 2B are cross-sectional views illustrating examples of a structure of a semiconductor device.

The semiconductor device illustrated in FIG. 2A includes the source electrode 142a electrically connected to the wiring 111; the drain electrode 142b; an electrode 156a which is formed in an opening provided in the oxide semiconductor layer 144, the gate insulating layer 146, the insulating layer 150, and the insulating layer 152 and electrically connected to the source electrode 142a; a wiring 158 which is formed over the insulating layer 152 and electrically connected to the electrode 156a; and an electrode 156b which is formed in an opening provided in the insulating layer 150 and the insulating layer 152 and electrically connected to the wiring 158 and the gate electrode 148a. Note that the other portions of the semiconductor device illustrated in FIG. 2A are similar to those of the semiconductor device illustrated in FIG. 1A. By employing such a structure, the semiconductor device can have a structure in which the gate electrode 148a of the transistor 162 and the wiring 111 formed in the lower layer are electrically connected to each other.

Figure 2B:
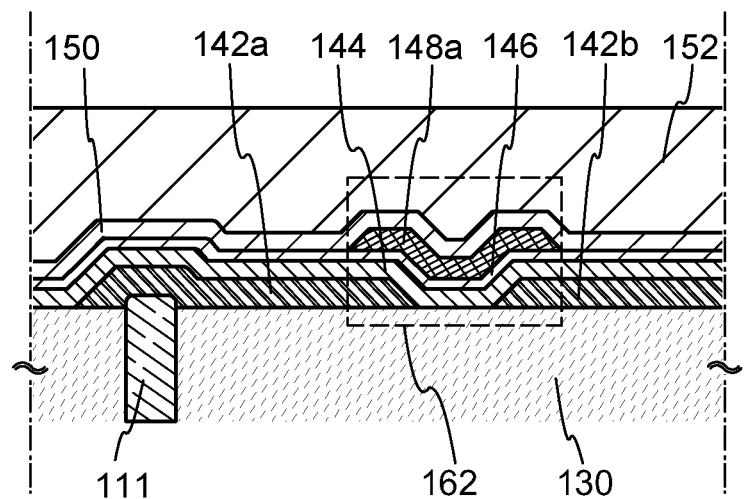

In addition, although the semiconductor device illustrated in FIG. 1A has a structure in which the source electrode 142a and the drain electrode 142b are embedded in the insulating layer including the insulating layer 143a, the source electrode 142a and the drain electrode 142b may be formed over the insulating layer 130 without being embedded in the insulating layer as illustrated in FIG. 2B, for example. In the semiconductor device illustrated in FIG. 2B, the same reference numerals are used for portions common to those of the semiconductor device illustrated in FIG. 1A.

The semiconductor device illustrated in FIG. 2B has almost the same structure as the semiconductor device illustrated in FIG. 1A, and includes the oxide semiconductor layer 144 formed over the insulating layer 130 where the wiring 111 is embedded, the source electrode 142a and the drain electrode 142b electrically connected to the oxide semiconductor layer 144, the gate electrode 148a provided to overlap with the oxide semiconductor layer 144, and the gate insulating layer 146 provided between the oxide semiconductor layer 144 and the gate electrode 148a. Further, the insulating layer 150 and the insulating layer 152 may be formed over the transistor 162 so as to cover the gate insulating layer 146, the gate electrode 148a, and the like. The insulating layer 130 is formed so that at least part of a top surface of the wiring 111 is exposed. The part of the top surface of the wiring 111 is positioned higher than part of a surface of the insulating layer 130, and the wiring 111 in the region exposed from the insulating layer 130 is electrically connected to the source electrode 142a or the drain electrode 142b.

Note that since the oxide semiconductor layer 144 is formed over and in contact with the insulating layer 130 in the semiconductor device illustrated in FIG. 2B, it is preferable that the root-mean-square (RMS) roughness of a region which is part of the surface of the insulating layer 130 (the part particularly refers to a region parallel to a surface where a layer is formed) and in contact with the oxide semiconductor layer 144 be less than or equal to 1 nm.

As illustrated in FIG. 2B, the source electrode 142a and the drain electrode 142b may be tapered in the transistor 162. The taper angle can be greater than or equal to 30° and less than or equal to 60°, for example. Note that the taper angle refers to an inclination angle formed with a side surface and a bottom surface of a layer having a tapered shape (e.g., the source electrode 142a or the drain electrode 142b) in the case where the layer is observed from a direction perpendicular to a cross section (a plane perpendicular to the surface of the insulating layer 130).

By applying a structure similar to that of the semiconductor device illustrated in FIG. 2A to the semiconductor device illustrated in FIG. 2B, the semiconductor device can have a structure in which the wiring 111 and the gate electrode 148a are electrically connected to each other.

<Example of Method for Manufacturing Semiconductor Device>

Next, an example of a method for manufacturing the above semiconductor device will be described with reference to FIGS. 3A to 3E and FIGS. 4A to 4C. Here, FIGS. 3A to 3E and FIGS. 4A to 4C illustrate an example of a method for manufacturing the transistor 162 in FIG. 1A which is formed over the insulating layer 130 where the wiring 111 is embedded and electrically connected to the wiring 111 via the source electrode 142a.

FIGS. 3A to 3E and FIGS. 4A to 4C will be described below. First, over a substrate having a surface where a layer is formed, the insulating layer 130 and the wiring 111 embedded in the insulating layer 130 are formed (see FIG. 3A).

Although there is no particular limitation on a substrate which can be used as the substrate having a surface where a layer is formed, it is necessary that the substrate have at least heat resistance enough to withstand heat treatment performed later. For example, a substrate such as a glass substrate, a ceramic substrate, a quartz substrate, or a sapphire substrate can be used as a base. As long as the substrate has an insulating surface, a single crystal semiconductor substrate or a polycrystalline semiconductor substrate of silicon, silicon carbide, or the like; a compound semiconductor substrate of silicon germanium or the like; an SOI substrate; or the like can be used as the base. Further, a structure in which a semiconductor element is provided over the substrate may be employed as the base. A base film may be formed over the substrate having a surface where a layer is formed.

Note that it is preferable that the surface where a layer is formed of the substrate be sufficiently flat. For example, a surface whose root-mean-square (RMS) roughness is less than or equal to 1 nm (preferably less than or equal to 0.5 nm) is employed as the surface where a layer is formed. By forming the transistor 162 over such a surface, characteristics thereof can be sufficiently improved. In the case where the planarity of the surface where a layer is formed of the substrate is insufficient, the surface is preferably subjected to chemical mechanical polishing (CMP) treatment, etching treatment, or the like so as to have planarity that satisfies the above condition. For details of the CMP treatment, description of CMP treatment performed on an insulating layer 143 later can be referred to.

Here, the wiring 111 can be formed in such a manner that a conductive layer is formed over the surface where a layer is formed of the substrate and the conductive layer is selectively etched. The conductive layer can be formed by a PVD method typified by a sputtering method or a CVD method such as a plasma CVD method. As a material of the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these may be used. In addition, the conductive layer may have a single-layer structure or a stacked-layer structure including two or more layers.

The insulating layer 130 is formed so as to cover the wiring 111. The insulating layer 130 can be formed using a material including an inorganic insulating material such as silicon oxide, silicon oxynitride, or aluminum oxide. In particular, the insulating layer 130 is preferably formed using a low dielectric constant (low-k) material, whereby capacitance caused by an overlap of electrodes or wirings can be sufficiently reduced. Note that a porous insulating layer including any of these materials may be used for the insulating layer 130. Since the porous insulating layer has low dielectric constant as compared to a dense insulating layer, capacitance due to electrodes or wirings can be further reduced. Moreover, the insulating layer 130 can be formed using an organic insulating material such as polyimide or acrylic. Note that the insulating layer 130 has a single-layer structure in this embodiment; however, an embodiment of the disclosed invention is not limited to this. The insulating layer 130 may have a stacked-layer structure including two or more layers. For example, the insulating layer 130 may have a structure in which silicon oxynitride is stacked over silicon oxide. Only an inorganic insulating material including a large amount of oxygen, such as silicon oxynitride or silicon oxide, is used for the insulating layer 130, whereby CMP treatment can be easily performed on the insulating layer 130 in a later step.

Note that in this specification, "silicon oxynitride" refers to a substance that includes more oxygen than nitrogen, and "silicon nitride oxide" refers to a substance that includes more nitrogen than oxygen.

Figure 3A:
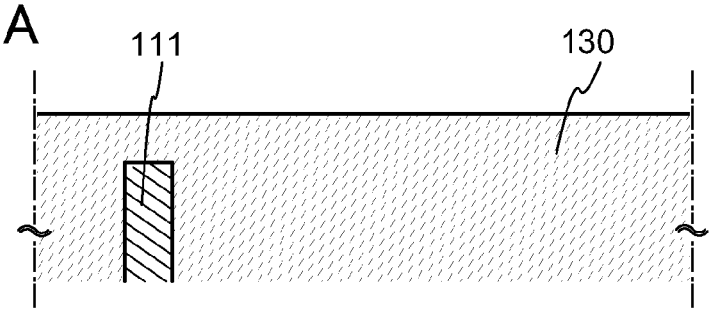
FIGS. 3A to 3E are cross-sectional views illustrating a manufacturing process of a semiconductor device.
Figure 3B:
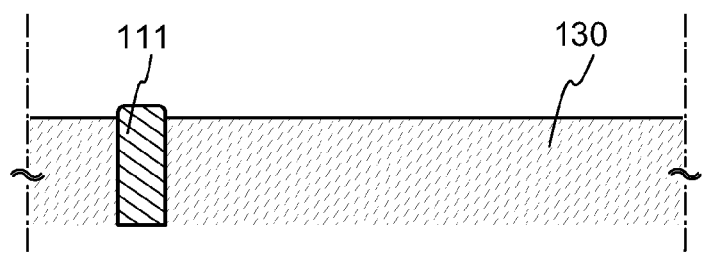

Next, planarization treatment is performed on a surface of the insulating layer 130; thus, the insulating layer 130 partly has a surface with a root-mean-square (RMS) roughness of less than or equal to 1 nm, at least part of a top surface of the wiring 111 is exposed, and the part of the top surface of the wiring 111 is formed in a higher position than part of the surface of the insulating layer 130 (see FIG. 3B). As the planarization treatment for the insulating layer 130, chemical mechanical polishing (CMP) treatment is performed.

Here, the CMP treatment is a method of planarizing a surface of an object to be processed by a combination of chemical and mechanical actions with the use of the surface as a reference. In general, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, it is preferable that first polishing with a high polishing rate be performed and then final polishing with a low polishing rate be performed. By combining polishing with different polishing rates in this manner, the planarity of the surface of the insulating layer 130 can be further improved.

By the above CMP treatment, the root-mean-square (RMS) roughness of at least part of the surface of the insulating layer 130 is preferably made to be less than or equal to 1 nm. The root-mean-square (RMS) roughness of the part of the top surface of the wiring 111 is preferably less than or equal to 2 nm.

At this time, the surface of the insulating layer 130 is planarized, at least part of the top surface of the wiring 111 is exposed, and the part of the top surface of the wiring 111 is formed in a higher position than the part of the surface of the insulating layer 130. Here, the difference in height between the part of the top surface of the wiring 111 and the part of the surface of the insulating layer 130 is preferably 0.1 times to 5 times as large as the thickness of the gate insulating layer 146.

Further, when the part of the top surface of the wiring 111 is exposed by the CMP treatment, an edge portion of the top surface of the wiring 111 can be polished and the edge portion of the top surface of the wiring 111 can have a smooth shape, preferably a shape having a surface curved smoothly from the surface of the insulating layer 130 to a top end portion of the projecting wiring 111. By providing such a smooth curved surface on the top end portion of the wiring 111 which projects from the insulating layer 130, the wiring 111 and the source electrode 142a can be in close contact with each other without a space therebetween. Accordingly, the contact resistance between the wiring 111 and the source electrode 142a can be further reduced. Furthermore, even when the thickness of the source electrode 142a is reduced, disconnection in an intersection with the wiring 111 can be prevented.

Figure 3C:
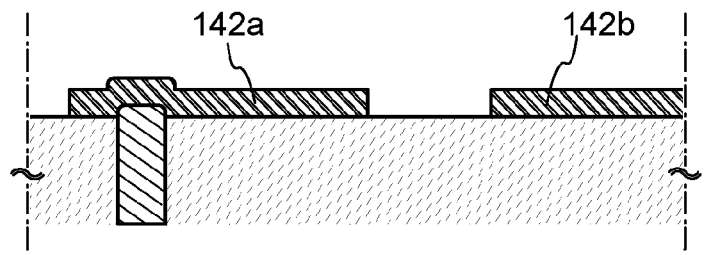

Next, the source electrode 142a and the drain electrode 142b are formed over the surface of the insulating layer 130 so that the source electrode 142a or the drain electrode 142b is electrically connected to the wiring 111 in a region where the wiring 111 is exposed from the insulating layer 130 (see FIG. 3C).

The source electrode 142a and the drain electrode 142b can be formed in such as manner that a conductive layer is formed over the insulating layer 130 so as to be in contact with the wiring 111 and the conductive layer is selectively etched.

The above conductive layer can be formed by a PVD method typified by a sputtering method or a CVD method such as a plasma CVD method. As a material of the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these may be used.

The conductive layer may have a single-layer structure or a stacked-layer structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, and the like can be given. Note that in the case where the conductive layer has a single-layer structure of a titanium film or a titanium nitride film, there is an advantage in that the conductive layer is easily processed into the source electrode 142a and the drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

Note that the conductive layer may be etched either by dry etching or wet etching; however, dry etching is preferable for miniaturization because its controllability is favorable. Further, the etching may be performed so that the source electrode 142a and the drain electrode 142b are tapered. The taper angle can be greater than or equal to 30° and less than or equal to 60°, for example.

The channel length (L) of the transistor 162 is determined by a distance between an upper end portion of the source electrode 142a and an upper end portion of the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure with extreme ultraviolet rays, the resolution is high and the focus depth is large. For these reasons, the channel length (L) of the transistor formed later can be less than 2 μm, preferably greater than or equal to 10 nm and less than or equal to 350 nm (0.35 μm), and the circuit can operate at higher speed. Moreover, miniaturization can lead to low power consumption of the semiconductor device.

As described above, by forming the part of the top surface of the wiring 111 in a higher position than the part of the surface of the insulating layer 130, a reduction in the area of a portion where the wiring 111 is in contact with the source electrode 142a can be prevented; thus, the contact resistance between the wiring 111 and the source electrode 142a can be reduced. Moreover, since the part of the top surface of the wiring 111 has favorable planarity, adhesion between the wiring 111 and the source electrode 142a is favorable; accordingly, the contact resistance can be further reduced. Consequently, the amount of heat generation or power consumption of the transistor 162 whose source electrode 142a is electrically connected to the wiring 111 can be reduced.

When the part of the top surface of the wiring 111 is formed in a higher position than the part of the surface of the insulating layer 130, a region of the source electrode 142a, which overlaps with the wiring 111, projects as illustrated in FIG. 3C; this portion can be removed by CMP treatment or the like so that a top surface of the source electrode 142a is planarized. By this treatment, the contact resistance between the oxide semiconductor layer 144 formed in a later step and the source electrode 142a can be reduced; therefore, the amount of heat generation or power consumption of the transistor 162 can be reduced and the mobility of the transistor 162 can be improved. Moreover, it is possible to prevent disconnection (wiring disconnection) or the like of the oxide semiconductor layer 144 or the gate insulating layer 146 due to a difference in height.

Figure 3D:
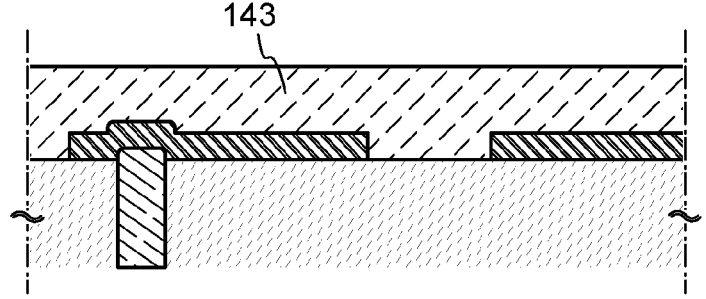

Next, the insulating layer 143 is formed so as to cover the source electrode 142a and the drain electrode 142b (see FIG. 3D).

The insulating layer 143 can be formed using a material including an inorganic insulating material such as silicon oxide, silicon oxynitride, silicon nitride, or aluminum oxide. It is particularly preferable that the insulating layer 143 be formed using silicon oxide because the insulating layer 143 is in contact with the oxide semiconductor layer 144 later. There is no particular limitation on a formation method of the insulating layer 143; in consideration of the fact that the insulating layer 143 is in contact with the oxide semiconductor layer 144, a method in which hydrogen is sufficiently reduced is preferably employed. An example of such a method is a sputtering method. Needless to say, another film formation method, typically a plasma CVD method, may be employed.

Figure 3E:
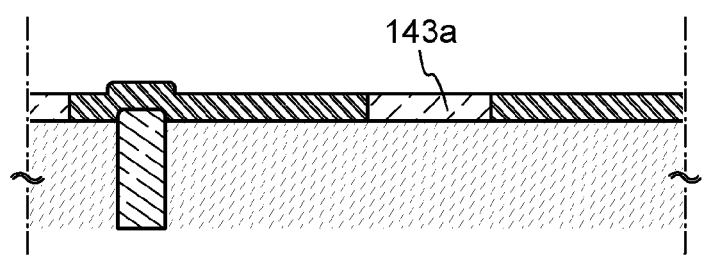

Next, the insulating layer 143 is planarized by chemical mechanical polishing (CMP) treatment, so that the insulating layer 143a is formed (see FIG. 3E). Here, the CMP treatment is performed under the condition where at least part of surfaces of the source electrode 142a and the drain electrode 142b is exposed. In addition, the CMP treatment is performed under the condition where the root-mean-square (RMS) roughness of a surface of the insulating layer 143a is less than or equal to 1 nm (preferably less than or equal to 0.5 nm). By performing the CMP treatment under such conditions, the planarity of a surface where the oxide semiconductor layer 144 is formed later is improved and characteristics of the transistor 162 can be improved.

Note that the CMP treatment may be performed only once or plural times. When the CMP treatment is performed plural times, it is preferable that first polishing with a high polishing rate be performed and then final polishing with a low polishing rate be performed. By combining polishing with different polishing rates in this manner, the planarity of the surface of the insulating layer 143a can be further improved.

By the above CMP treatment, the difference in height between an upper end portion of the insulating layer 143a and an upper end portion of the source electrode 142a, which are in contact with each other, or the difference in height between another upper end portion of the insulating layer 143a and an upper end portion of the drain electrode 142b, which are in contact with each other, can be less than 5 nm.

Note that a high stress is applied to an interface between the source electrode 142a and the wiring 111 in the CMP treatment in some cases. However, the interface between the wiring 111 and the source electrode 142a has a three-dimensional structure, whereby adhesion between the wiring 111 and the source electrode 142a is improved and the physical strength in attachment of the wiring 111 and the source electrode 142a is improved. Therefore, the CMP treatment can be performed without peeling of the source electrode 142a.

Figure 4A:
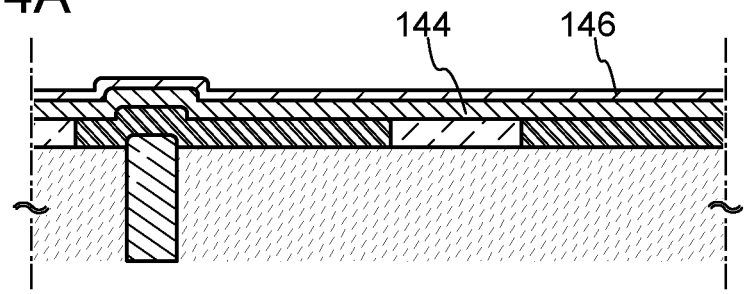
FIGS. 4A to 4C are cross-sectional views illustrating a manufacturing process of a semiconductor device.

Next, the oxide semiconductor layer 144 is formed so as to be partly in contact with a top surface of the source electrode 142a, a top surface of the drain electrode 142b, and a top surface of the insulating layer 143a, and then the gate insulating layer 146 is formed so as to cover the oxide semiconductor layer 144 (see FIG. 4A).

The oxide semiconductor layer 144 can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which is a three-component metal oxide; an In—Zn—O-based material, a Sn—Zn—O-based material, an Al—Zn—O-based material, a Zn—Mg—O-based material, a Sn—Mg—O-based material, or an In—Mg—O-based material which is a two-component metal oxide; an In—O-based material, a Sn—O-based material, or a Zn—O-based material which is a one-component metal oxide; or the like.

In particular, an In—Ga—Zn—O-based oxide semiconductor material has a sufficiently high resistance when there is no electric field and thus a sufficiently low off-state current can be obtained. In addition, having high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Moreover, there is an oxide semiconductor material represented by $InMO_3(ZnO)_m$ (m>0), using M instead of Ga. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are derived from the crystal structures that the oxide semiconductor material can have and are only examples.

In the case where an In—Zn—O-based material is used as the oxide semiconductor, the composition ratio of a target used is In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

As a target for forming the oxide semiconductor layer 144 by a sputtering method, it is preferable to use a target that is represented by a composition ratio of In:Ga:Zn=1:x:y (x is greater than or equal to 0, and y is greater than or equal to 0.5 and less than or equal to 5). For example, a target having a composition ratio of $In_2O_3$:$Ga_2O_3$:ZnO=1:1:2 [molar ratio] (x=1, y=1) or the like can be used. Alternatively, a target having a composition ratio of $In_2O_3$:$Ga_2O_3$:ZnO=1:1:1 [molar ratio] (x=1, y=0.5), a target having a composition ratio of $In_2O_3$:$Ga_2O_3$:ZnO=1:1:4 [molar ratio] (x=1, y=2), or a target having a composition ratio of $In_2O_3$:$Ga_2O_3$:ZnO=1:0:2 [molar ratio] (x=0, y=1) can be used.

In this embodiment, the oxide semiconductor layer 144 having an amorphous structure is formed by a sputtering method using a target for forming an In—Ga—Zn—O-based oxide semiconductor. In addition, the thickness thereof is greater than or equal to 1 nm and less than or equal to 50 nm, preferably greater than or equal to 2 nm and less than or equal to 20 nm, further preferably greater than or equal to 3 nm and less than or equal to 15 nm.

The relative density of a metal oxide in the target for forming an oxide semiconductor is 80% or higher, preferably 95% or higher, further preferably 99.9% or higher. With the use of a target for forming an oxide semiconductor with high relative density, an oxide semiconductor layer having a dense structure can be formed.

The atmosphere in which the oxide semiconductor layer 144 is formed is preferably a rare gas (typically argon) atmosphere, an oxygen atmosphere, or a mixed atmosphere including a rare gas (typically argon) and oxygen. Specifically, it is preferable to use, for example, an atmosphere of a high-purity gas from which an impurity such as hydrogen, water, a hydroxyl group, or hydride is removed so that the concentration is 1 ppm or lower (preferably the concentration is 10 ppb or lower).

In forming the oxide semiconductor layer 144, for example, an object to be processed is held in a treatment chamber kept under reduced pressure and the object to be processed is heated to a temperature of higher than or equal to 100° C. and lower than 550° C., preferably higher than or equal to 200° C. and lower than or equal to 400° C. Alternatively, the temperature of the object to be processed in the formation of the oxide semiconductor layer 144 may be room temperature (25° C.±10° C.). Then, moisture in the treatment chamber is removed, a sputtering gas from which hydrogen, water, and the like are removed is introduced, and the above target is used, so that the oxide semiconductor layer 144 is formed. By forming the oxide semiconductor layer 144 while heating the object to be processed, impurities in the oxide semiconductor layer 144 can be reduced. In addition, damage on the oxide semiconductor layer 144 due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By evacuation with a cryopump or the like, hydrogen, water, and the like can be removed from the treatment chamber; thus, the impurity concentration of the oxide semiconductor layer can be reduced.

The oxide semiconductor layer 144 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferably used because powder substances (also referred to as particles or dust) generated in film formation can be reduced and variation in thickness can be reduced. The thickness of the oxide semiconductor layer 144 is greater than or equal to 1 nm and less than or equal to 50 nm, preferably greater than or equal to 2 nm and less than or equal to 20 nm, further preferably greater than or equal to 3 nm and less than or equal to 15 nm. With the structure according to the disclosed invention, a short-channel effect due to miniaturization can be suppressed even when the oxide semiconductor layer 144 has such a thickness. Note that the appropriate thickness differs depending on the oxide semiconductor material to be used, the intended use of the semiconductor device, or the like; therefore, the thickness may be determined in accordance with the material, the intended use, or the like. By forming the insulating layer 143a in the above manner, a surface where a portion corresponding to a channel formation region of the oxide semiconductor layer 144 is formed can be sufficiently planarized; accordingly, even an oxide semiconductor layer having a small thickness can be favorably formed. In addition, as illustrated in FIG. 4A, a cross-sectional shape of the portion corresponding to the channel formation region of the oxide semiconductor layer 144 is preferably a flat shape. By making the cross-sectional shape of the portion corresponding to the channel formation region of the oxide semiconductor layer 144 flat, leakage current can be reduced as compared to the case where the cross-sectional shape of the oxide semiconductor layer 144 is not flat.

Note that before the oxide semiconductor layer 144 is formed by a sputtering method, a substance attached to a surface where the oxide semiconductor layer 144 is formed (e.g., the surface of the insulating layer 143a) may be removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed side in an argon atmosphere so that plasma is generated in the vicinity of the object to be processed. Note that a nitrogen atmosphere, a helium atmosphere, an oxygen atmosphere, or the like may be used instead of an argon atmosphere.

After the formation of the oxide semiconductor layer 144, heat treatment (first heat treatment) is preferably performed on the oxide semiconductor layer 144. Excessive hydrogen (including water and a hydroxyl group) in the oxide semiconductor layer 144 can be removed by the first heat treatment, so that the structure of the oxide semiconductor layer 144 can be ordered and defect levels in the energy gap can be reduced. The temperature of the first heat treatment is, for example, higher than or equal to 300° C. and lower than 550° C., preferably higher than or equal to 400° C. and lower than or equal to 500° C.

The heat treatment can be performed in such a manner that, for example, an object to be processed is introduced into an electric furnace in which a resistance heating element or the like is used and heated at 450° C. for 1 hour in a nitrogen atmosphere. During the heat treatment, the oxide semiconductor layer is not exposed to the air to prevent the entry of water and hydrogen.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, as the first heat treatment, GRTA treatment may be performed in the following manner. The object to be processed is put in an inert gas atmosphere that has been heated, heated for several minutes, and taken out of the inert gas atmosphere. The GRTA treatment enables high-temperature heat treatment in a short time. Moreover, GRTA treatment can be employed even when the temperature exceeds the upper temperature limit of the object to be processed. Note that the inert gas may be switched to a gas including oxygen during the treatment. This is because defect levels in the energy gap due to oxygen deficiency can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (i.e., the impurity concentration is 1 ppm or lower, preferably 0.1 ppm or lower).

In any case, an i-type (intrinsic) or substantially i-type oxide semiconductor layer in which impurities are reduced by the first heat treatment is formed, which enables a transistor having extremely excellent characteristics to be realized. Further, by forming the i-type (intrinsic) or substantially i-type oxide semiconductor layer, a problem of a transistor caused owing to the thickness of the oxide semiconductor layer can be suppressed.

The above heat treatment (first heat treatment) has an effect of removing hydrogen, water, and the like and thus can also be referred to as dehydration treatment, dehydrogenation treatment, or the like. The dehydration treatment or the dehydrogenation treatment can also be performed at any of the following timings: after the formation of the oxide semiconductor layer 144, after the formation of the gate insulating layer 146, after the formation of the gate electrode, and the like. Such dehydration treatment or dehydrogenation treatment may be performed once or plural times.

After the formation of the oxide semiconductor layer 144, the oxide semiconductor layer 144 may be processed into an island-shaped oxide semiconductor layer. The oxide semiconductor layer can be processed into an island shape by etching, for example. The etching may be performed either before or after the above heat treatment. In addition, dry etching is preferable in terms of miniaturization of an element, though wet etching may be employed. An etching gas and an etchant can be selected as appropriate in accordance with a material to be etched.

The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate (Hf-Si$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The gate insulating layer 146 may have a single-layer structure or a stacked-layer structure. There is no particular limitation on the thickness of the gate insulating layer 146; in the case where the semiconductor device is miniaturized, the gate insulating layer 146 is preferably thin in order to secure operation of the transistor. For example, in the case of using silicon oxide, the thickness can be greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, the thickness thereof can be increased for suppression of gate leakage with the electric characteristics maintained in a good condition. For example, the relative permittivity of hafnium oxide is approximately 15 and the value is significantly large as compared to 3 to 4, which is the relative permittivity of silicon oxide. With the use of such a high dielectric constant material, a gate insulating layer having an equivalent oxide thickness of less than 15 nm, preferably greater than or equal to 2 nm and less than or equal to 10 nm, can be easily realized. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not limited to this. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

As described above, at least one of the first heat treatment and the second heat treatment is performed, whereby the oxide semiconductor layer 144 can be purified so that impurities other than main components are included as little as possible.

Figure 4B:
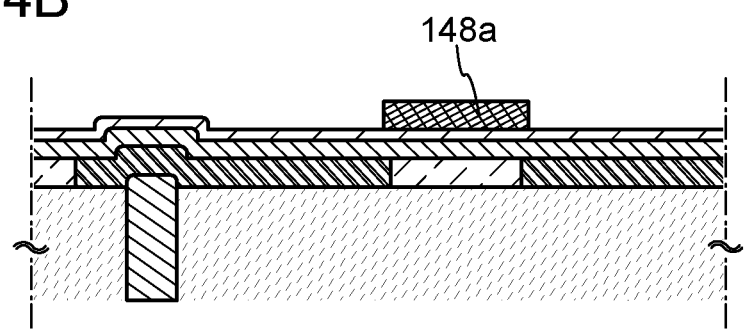

Next, the gate electrode 148a is formed over the gate insulating layer 146 (see FIG. 4B).

The gate electrode 148a can be formed in such a manner that a conductive layer is formed over the gate insulating layer 146 and then selectively etched. The conductive layer to be the gate electrode 148a can be formed by a PVD method typified by a sputtering method or a CVD method such as a plasma CVD method. The details are similar to those of the source electrode 142a, the drain electrode 142b, or the like; thus, description thereof can be referred to. Note that a structure in which part of the gate electrode 148a overlaps with the source electrode 142a and the drain electrode 142b is employed in this embodiment; however, the disclosed invention is not limited to this. A structure in which one end of the gate electrode 148a overlaps with an end of the source electrode 142a and the other end of the gate electrode 148a overlaps with an end of the drain electrode 142b can also be employed.

Figure 4C:
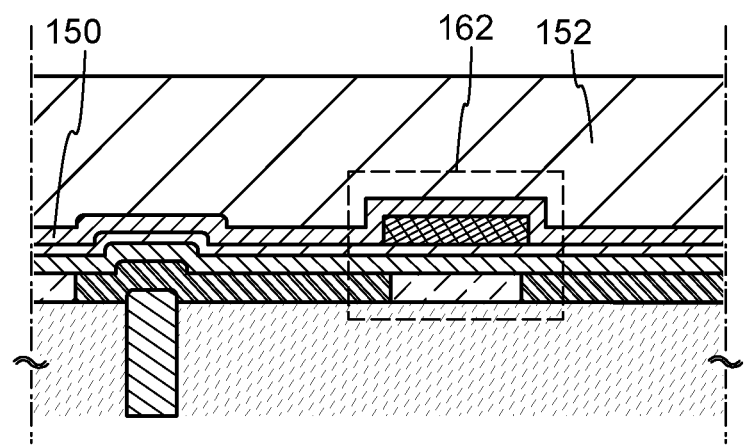

Next, the insulating layer 150 and the insulating layer 152 are formed so as to cover the gate insulating layer 146, the gate electrode 148a, and the like (see FIG. 4C). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that a low dielectric constant material or a structure having a low dielectric constant (such as a porous structure) is preferably employed for the insulating layer 150 and the insulating layer 152 because when the insulating layer 150 and the insulating layer 152 each have a low dielectric constant, capacitance generated between wirings, electrodes, or the like can be reduced and high-speed operation can be achieved.

Note that a stacked-layer structure of the insulating layer 150 and the insulating layer 152 is employed in this embodiment; however, an embodiment of the disclosed invention is not limited this. A single-layer structure or a stacked-layer structure including three or more layers may be employed. Moreover, it is possible to employ a structure in which the insulating layers are not provided.

Note that the insulating layer 152 is preferably formed so as to have a planarized surface. By forming the insulating layer 152 so as to have a planarized surface, an electrode, a wiring, or the like can be favorably formed over the insulating layer 152 even in the case where the semiconductor device is miniaturized, for example. The insulating layer 152 can be planarized using a method such as chemical mechanical polishing (CMP).

Through the above steps, the transistor 162 including the purified oxide semiconductor layer 144 is completed (see FIG. 4C).

Note that after the above steps, a variety of wirings, electrodes, and the like may be formed. The wiring and the electrode can be formed by a method such as a so-called damascene method or dual damascene method.

In the above-described manner, the channel formation region of the transistor 162 can be provided in an extremely flat region whose root-mean-square (RMS) roughness is less than or equal to 1 nm (preferably less than or equal to 0.5 nm). Accordingly, even when the transistor 162 is miniaturized, a problem such as a short-channel effect can be prevented and thus the transistor 162 can have favorable characteristics.

Further, in the transistor 162 described in this embodiment, the oxide semiconductor layer 144 is purified and thus the hydrogen concentration thereof is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. In addition, the value of the density of carriers due to a donor such as hydrogen in the oxide semiconductor layer 144 is sufficiently small (e.g., lower than $1\times10^{12}$/cm$^3$, preferably lower than $1.45\times10^{10}$/cm$^3$) as compared with the carrier density of a general silicon wafer (approximately $1\times10^{14}$/cm$^3$). Thus, the off-state current of the transistor 162 is sufficiently small. For example, the off-state current (here, current per micrometer (μm) of channel width) of the transistor 162 at room temperature (25° C.) is less than or equal to 100 zA (1 zA (zeptoampere) is $1\times10^{-21}$ A), preferably less than or equal to 10 zA. In the case where the above structure is employed, the off-state current of the transistor can be $1\times10^{-24}$ A/μm to $1\times10^{-30}$ A/μm in theory.

With the use of the purified and intrinsic oxide semiconductor layer 144, a sufficient reduction in the off-state current of the transistor can be easily achieved.

Moreover, by forming the part of the top surface of the wiring 111 in a higher position than the part of the surface of the insulating layer 130, a reduction in the area of a portion where the wiring 111 is in contact with the source electrode 142*a* can be prevented; thus the contact resistance between the wiring 111 and the source electrode 142*a* can be reduced. As a result, the amount of heat generation or power consumption of the transistor 162 which is electrically connected to the wiring 111 in the lower layer can be reduced; accordingly, the wiring and the transistor can be stacked with the amount of heat generation or power consumption of the transistor suppressed. Consequently, by forming a stacked-layer structure with the use of the miniaturized transistor and the wiring, three-dimensional high integration of the semiconductor device can be achieved with favorable transistor characteristics maintained.

The structures, methods, and the like described in this embodiment can be combined as appropriate with any of the structures, methods, and the like described in the other embodiments.

Embodiment 2

In this embodiment, a structure and a manufacturing method of a semiconductor device according to another embodiment of the disclosed invention will be described with reference to FIGS. 5A to 5C, FIGS. 6A to 6C, FIGS. 7A to 7D, and FIGS. 8A to 8C.

<Example of Structure of Semiconductor Device>

Figure 5A:
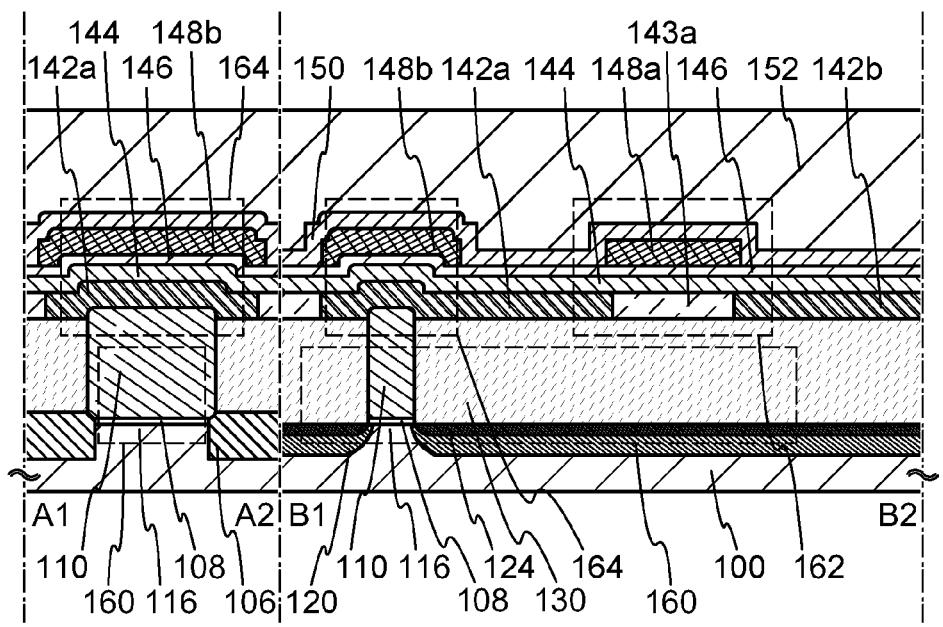
FIGS. 5A to 5C are a cross-sectional view, a plan view, and a circuit diagram, respectively, illustrating an example of a structure of a semiconductor device.
Figure 5B:
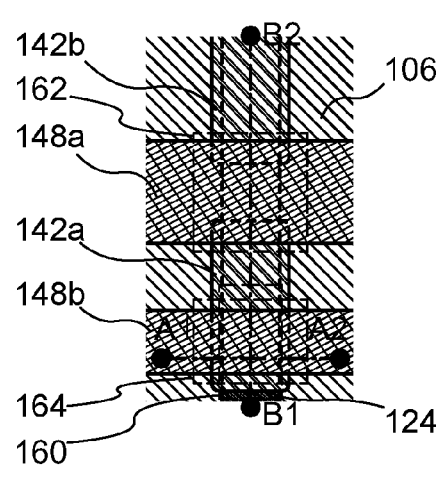
Figure 5C:
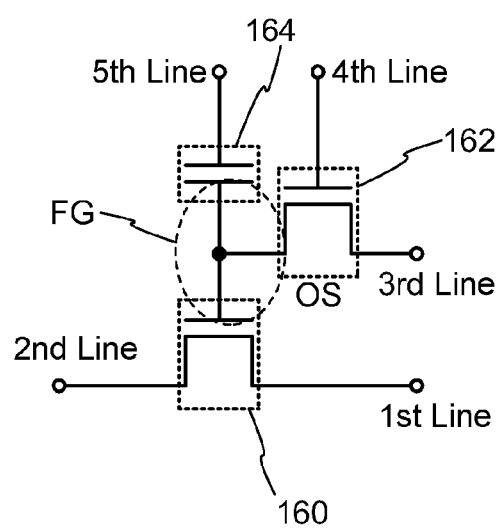

FIGS. 5A to 5C illustrate an example of a structure of a semiconductor device. FIGS. 5A to 5C illustrate a cross-sectional view, a plan view, and a circuit configuration of the semiconductor device, respectively. Note that operation of the semiconductor device will be described in detail in the following embodiment; in this embodiment, the structure of the semiconductor device will be mainly described. Note that the semiconductor device illustrated in FIGS. 5A to 5C is an example of a semiconductor device having a predetermined function and does not exhaustively represent the semiconductor device of the disclosed invention. The semiconductor device according to the disclosed invention can have another function by changing connection of an electrode or the like as appropriate.

FIG. 5A corresponds to a cross section along line A1-A2 and line B1-B2 in FIG. 5B. The semiconductor device illustrated in FIGS. 5A and 5B includes a transistor 160 below the transistor 162 described in the above embodiment and a capacitor 164, in addition to the transistor 162. Although the wiring 111 and the source electrode 142*a* are electrically connected to each other in FIG. 1A of the above embodiment, a gate electrode 110 of the transistor 160 is electrically connected to the source electrode 142*a* of the transistor 162 in this embodiment.

Here, it is preferable that a semiconductor material of the transistor 162 and a semiconductor material of the transistor 160 be different materials. For example, an oxide semiconductor can be used as the semiconductor material of the transistor 162, and a semiconductor material (such as silicon) other than an oxide semiconductor can be used for the transistor 160. A transistor including an oxide semiconductor can hold charge for a long time owing to its characteristics. On the other hand, a transistor including a material other than an oxide semiconductor can operate at high speed easily.

The transistor 160 in FIGS. 5A to 5C includes a channel formation region 116 provided in a substrate 100 including a semiconductor material (e.g., silicon), impurity regions 120 provided with the channel formation region 116 positioned therebetween, metal compound regions 124 in contact with the impurity regions 120, a gate insulating layer 108 provided over the channel formation region 116, and the gate electrode 110 provided over the gate insulating layer 108. Note that a transistor whose source electrode and drain electrode are not illustrated in the drawing may be referred to as a transistor for the sake of convenience. Further, in such a case, in description of connection of a transistor, a source region and a source electrode are collectively referred to as a "source electrode", and a drain region and a drain electrode are collectively referred to as a "drain electrode". In other words, in this specification, the term "source electrode" may include a source region and the term "drain electrode" may include a drain region.

Further, an element isolation insulating layer 106 is provided over the substrate 100 so as to surround the transistor 160, and the insulating layer 130 is provided so as to cover the transistor 160. Note that in order to realize high integration, it is preferable that the transistor 160 do not have a sidewall insulating layer as illustrated in FIGS. 5A to 5C. On the other hand, in the case where characteristics of the transistor 160 are emphasized, a sidewall insulating layer may be provided on a side surface of the gate electrode 110 and the impurity regions 120 may include a region having a different impurity concentration.

The insulating layer 130 is formed over the transistor 160 so that at least part of a top surface of the gate electrode 110 is exposed. The part of the top surface of the gate electrode 110 is positioned higher than part of a surface of the insulating layer 130, and the gate electrode 110 in the region exposed from the insulating layer 130 is electrically connected to the source electrode 142*a* (drain electrode in some cases). Here, part of the surface of the insulating layer 130 and the part of the top surface of the gate electrode 110 have favorable planarity. The root-mean-square (RMS) roughness of the part of the surface of the insulating layer 130 is preferably less than or equal to 1 nm. The root-mean-square (RMS) roughness of the part of the top surface of the gate electrode 110 is preferably less than or equal to 2 nm Note that in this specification, the part of the top surface of the gate electrode 110 refers to a region which is in the top surface of the gate electrode 110 and parallel to a surface where a layer is formed.

In addition, the difference in height between the part of the top surface of the gate electrode 110 and the part of the surface of the insulating layer 130 is preferably 0.1 times to 5 times as large as the thickness of the gate insulating layer 146.

The structure of the transistor 162 in FIGS. 5A to 5C is similar to the structure of the transistor 162 in the above embodiment. Note that in this embodiment, the gate electrode 110 of the transistor 160 is provided instead of the wiring 111 and the source electrode 142a (drain electrode in some cases) of the transistor 162 is connected to the gate electrode 110 of the transistor 160.

As described in the above embodiment, by providing a channel formation region of the transistor 162 in an extremely flat region whose root-mean-square (RMS) roughness is less than or equal to 1 nm, a problem such as a short-channel effect can be prevented even when the transistor 162 is miniaturized and thus the transistor 162 having favorable characteristics can be provided.

By employing the above structure and forming the part of the top surface of the gate electrode 110 in a higher position than the part of the surface of the insulating layer 130, a reduction in the area of a portion where the gate electrode 110 is in contact with the source electrode 142a can be prevented; thus the contact resistance between the gate electrode 110 and the source electrode 142a can be reduced. Moreover, since the part of the top surface of the gate electrode 110 has favorable planarity, adhesion between the gate electrode 110 and the source electrode 142a is favorable; accordingly, the contact resistance can be further reduced. Consequently, the amount of heat generation or power consumption of the transistor 162 whose source electrode 142a is electrically connected to the gate electrode 110 can be reduced.

Further, when the part of the top surface of the gate electrode 110 is exposed by CMP treatment or the like, an edge portion of the top surface of the gate electrode 110 can be polished and the edge portion of the top surface of the gate electrode 110 can have a smooth shape, preferably a shape having a surface curved smoothly from the surface of the insulating layer 130 to a top end portion of the projecting gate electrode 110. By providing such a smooth curved surface on the top end portion of the gate electrode 110 which projects from the insulating layer 130, the gate electrode 110 and the source electrode 142a can be in close contact with each other without a space therebetween. Accordingly, the contact resistance between the gate electrode 110 and the source electrode 142a can be further reduced. Furthermore, even when the thickness of the source electrode 142a is reduced, disconnection in an intersection with the gate electrode 110 can be prevented.

The capacitor 164 in FIGS. 5A to 5C includes the source electrode 142a (drain electrode in some cases), the oxide semiconductor layer 144, the gate insulating layer 146, and an electrode 148b. That is, the source electrode 142a functions as one electrode of the capacitor 164, and the electrode 148b functions as the other electrode of the capacitor 164. Note that the electrode 148b is formed through steps similar to those of the gate electrode 148a of the transistor 162.

Note that in the capacitor 164 in FIGS. 5A to 5C, insulation between the source electrode 142a and the electrode 148b can be adequately secured by stacking the oxide semiconductor layer 144 and the gate insulating layer 146. Needless to say, the capacitor 164 may have a structure without the oxide semiconductor layer 144 in order to secure sufficient capacitance. In the case where a capacitor is not needed, it is possible to employ a structure without the capacitor 164.

In this embodiment, the transistor 162 and the capacitor 164 are provided so as to overlap with the transistor 160. By employing such a planar layout, high integration is possible. For example, given that the minimum feature size is F, the area occupied by the above semiconductor device can be 15 $F^2$ to 25 $F^2$.

Note that the structure of a semiconductor device according to the disclosed invention is not limited to the structure illustrated in FIGS. 5A to 5C. Since the technical spirit of an embodiment of the disclosed invention is formation of a stacked-layer structure using an oxide semiconductor and a material other than an oxide semiconductor, details such as connection of an electrode or the like can be modified as appropriate.

Figure 6A:
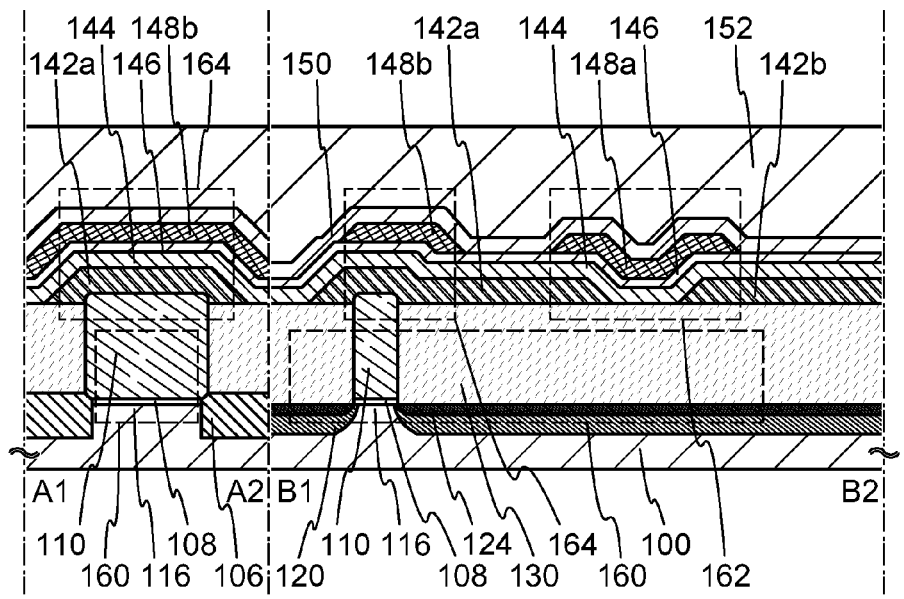
FIGS. 6A to 6C are a cross-sectional view, a plan view, and a circuit diagram, respectively, illustrating an example of a structure of a semiconductor device.
Figure 6B:
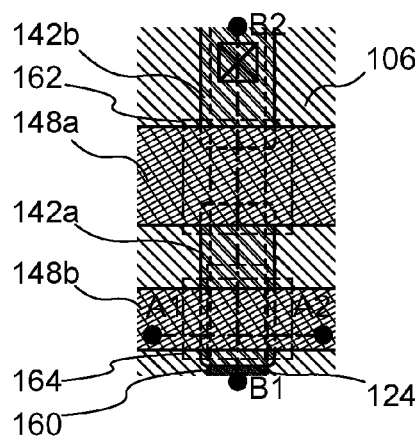
Figure 6C:
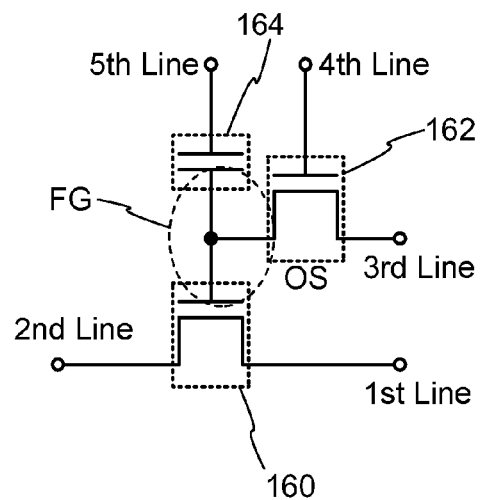

In addition, although the semiconductor device illustrated in FIGS. 5A to 5C has a structure in which the source electrode 142a and the drain electrode 142b are embedded in an insulating layer including the insulating layer 143a, the source electrode 142a and the drain electrode 142b may be formed over the insulating layer 130 without being embedded in the insulating layer as illustrated in FIGS. 6A to 6C, for example. Here, FIGS. 6A to 6C illustrate a cross-sectional view, a plan view, and a circuit configuration of a semiconductor device, respectively. In addition, in the semiconductor device illustrated in FIGS. 6A to 6C, the same reference numerals are used for portions common to those of the semiconductor device illustrated in FIGS. 5A to 5C.

The semiconductor device illustrated in FIGS. 6A to 6C has almost the same structure as the semiconductor device illustrated in FIGS. 5A to 5C. The transistor 162 includes the oxide semiconductor layer 144 formed over the insulating layer 130, the source electrode 142a and the drain electrode 142b electrically connected to the oxide semiconductor layer 144, the gate electrode 148a provided to overlap with the oxide semiconductor layer 144, and the gate insulating layer 146 provided between the oxide semiconductor layer 144 and the gate electrode 148a. Further, the insulating layer 150 and the insulating layer 152 may be formed over the transistor 162 so as to cover the gate insulating layer 146, the gate electrode 148a, and the like. The insulating layer 130 is formed over the transistor 160 so that at least part of a top surface of the gate electrode 110 of the transistor 160 is exposed. The part of the top surface of the gate electrode 110 is positioned higher than part of a surface of the insulating layer 130, and the gate electrode 110 in the region exposed from the insulating layer 130 is electrically connected to the source electrode 142a or the drain electrode 142b. In addition, the transistor 160 and the capacitor 164 of the semiconductor device illustrated in FIGS. 6A to 6C have almost the same structures as those of the semiconductor device illustrated in FIGS. 5A to 5C.

Note that since the oxide semiconductor layer 144 is formed over and in contact with the insulating layer 130 in the semiconductor device illustrated in FIGS. 6A to 6C, it is preferable that the root-mean-square (RMS) roughness of a region which is part of the surface of the insulating layer 130 (the part particularly refers to a region parallel to a surface where a layer is formed) and in contact with the oxide semiconductor layer 144 be less than or equal to 1 nm.

As illustrated in FIGS. 6A to 6C, the source electrode 142a and the drain electrode 142b may be tapered in the transistor 162. The taper angle can be greater than or equal to 30° and less than or equal to 60°, for example. Note that the taper angle refers to an inclination angle formed with a side surface and a bottom surface of a layer having a tapered shape (e.g., the source electrode 142a or the drain electrode 142b) in the case where the layer is observed from a direction perpendicular to a cross section (a plane perpendicular to the surface of the insulating layer 130).

<Method for Manufacturing Semiconductor Device>

Next, an example of a method for manufacturing the above semiconductor device will be described with reference to FIGS. 7A to 7D and FIGS. 8A to 8C. Note that FIGS. 7A to 7D and FIGS. 8A to 8C correspond to cross sections along line A1-A2 and line B1-B2 in FIG. 5B. A method for manufacturing the transistor 162 is similar to that in the above embodiment; therefore, a method for manufacturing the transistor 160 will be mainly described in this embodiment.

Figure 7A:
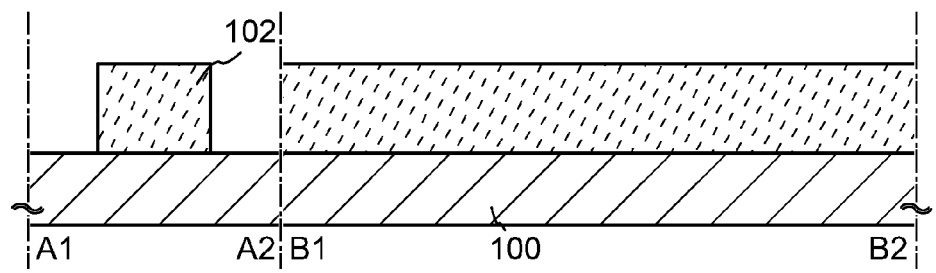
FIGS. 7A to 7D are cross-sectional views illustrating a manufacturing process of a semiconductor device.
Figure 7B:
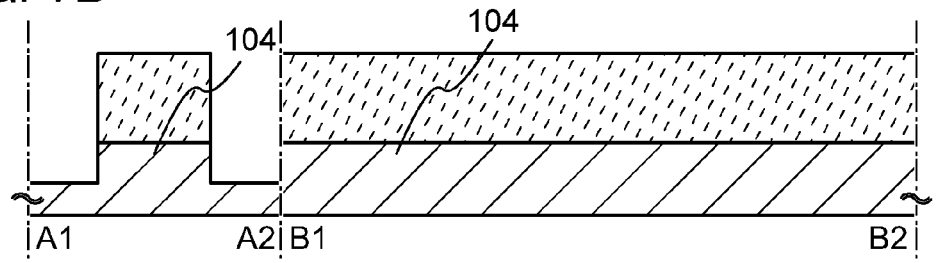

First, the substrate 100 including a semiconductor material is prepared (see FIG. 7A). As the substrate 100 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer positioned therebetween.

It is particularly preferable that a single crystal semiconductor substrate of silicon or the like be used as the substrate 100 including a semiconductor material because high-speed reading operation in the semiconductor device is possible.

Note that in order to control threshold voltage of the transistor, an impurity element may be added to a region which serves as the channel formation region 116 of the transistor 160 later. Here, an impurity element imparting conductivity with which the transistor 160 has positive threshold voltage is added. In the case where the semiconductor material is silicon, examples of the impurity imparting the conductivity include boron, aluminum, and gallium. After the addition of the impurity element, heat treatment is preferably performed so that the impurity element is activated and defects generated at the time of the addition of the impurity element are repaired, for example.

Next, a protective layer 102 which serves as a mask for forming an element isolation insulating layer is formed over the substrate 100 (see FIG. 7A). As the protective layer 102, an insulating layer formed using silicon oxide, silicon nitride, silicon oxynitride, or the like can be used, for example.

Next, part of the substrate 100 in a region that is not covered with the protective layer 102 (in an exposed region) is removed by etching using the protective layer 102 as a mask. Thus, a semiconductor region 104 isolated from the other semiconductor regions is formed (see FIG. 7B). As the etching, dry etching is preferably performed, but wet etching may be performed. An etching gas and an etchant can be selected as appropriate in accordance with a material to be etched.

Figure 7C:
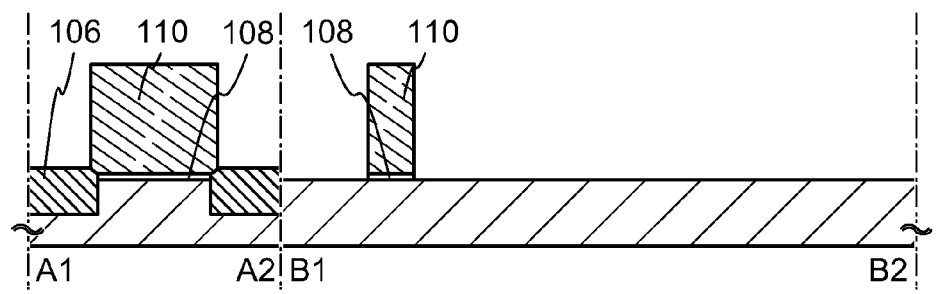

Then, an insulating layer is formed so as to cover the semiconductor region 104, and the insulating layer in a region overlapping with the semiconductor region 104 is selectively removed, so that the element isolation insulating layer 106 is formed (see FIG. 7C). The insulating layer is formed using silicon oxide, silicon nitride, silicon oxynitride, or the like. As a method for removing the insulating layer, there are etching treatment and polishing treatment such as chemical mechanical polishing (CMP) treatment, and any of them may be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is to be a gate insulating layer later and can be formed by performing heat treatment (such as thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and oxygen, nitrogen oxide, ammonia, nitrogen, hydrogen, or the like. Needless to say, the insulating layer may be formed using a CVD method, a sputtering method, or the like. The insulating layer preferably has a single-layer structure or a stacked-layer structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. Note that an example of the case where the layer including a conductive material is formed using a metal material is described in this embodiment.

After that, the insulating layer and the layer including a conductive material are selectively etched, so that the gate insulating layer 108 and the gate electrode 110 are formed (see FIG. 7C).

Figure 7D:
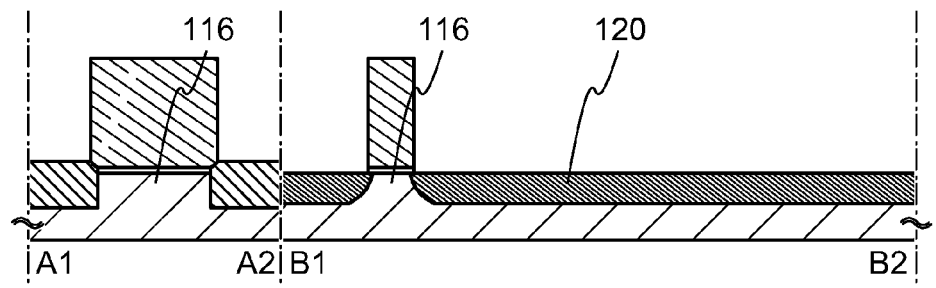

Next, phosphorus (P), arsenic (As), or the like is added to the semiconductor region 104, so that the channel formation region 116 and the impurity regions 120 are formed (see FIG. 7D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased in the case where the semiconductor element is highly miniaturized.

Note that a sidewall insulating layer may be formed in the periphery of the gate electrode 110 so that an impurity region to which an impurity element is added at a different concentration is formed.

Figure 8A:
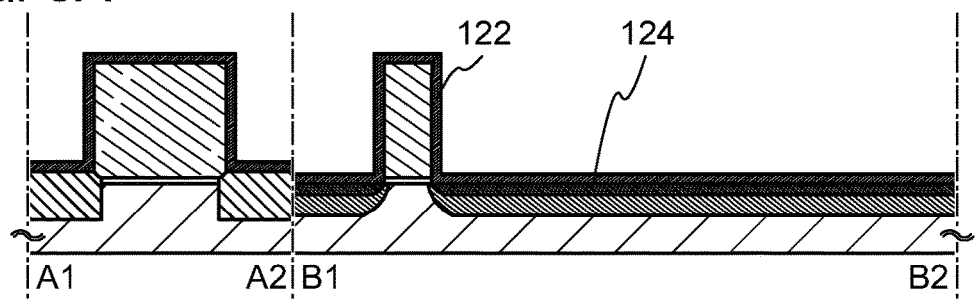
FIGS. 8A to 8C are cross-sectional views illustrating a manufacturing process of a semiconductor device.

Next, a metal layer 122 is formed so as to cover the gate electrode 110, the impurity regions 120, and the like (see FIG. 8A). A variety of film formation methods such as a vacuum evaporation method, a sputtering method, and a spin coating method can be employed for forming the metal layer 122. The metal layer 122 is preferably formed using a metal material that reacts with a semiconductor material included in the semiconductor region 104 to be a low-resistance metal compound. Examples of such a metal material include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 8A). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment in an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 8B:
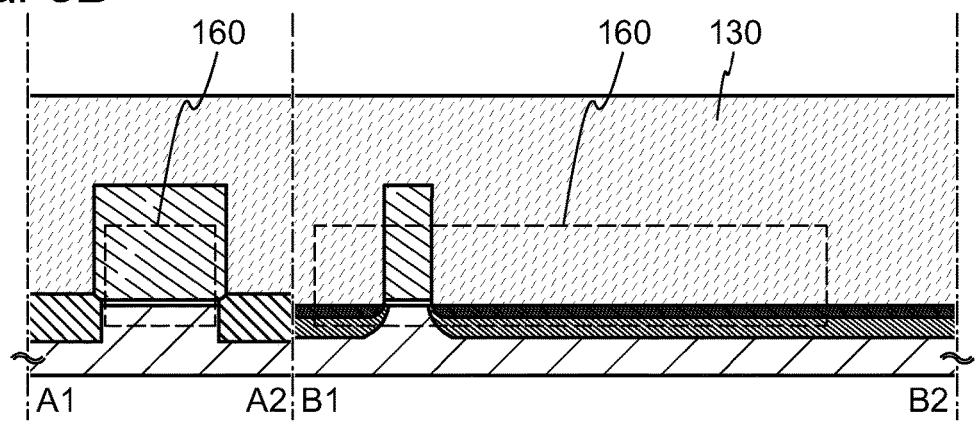

Next, the insulating layer 130 is formed so as to cover the components formed in the above steps (see FIG. 8B). The insulating layer 130 can be formed using a material and a structure similar to those of the above embodiment; therefore, the above embodiment can be referred to for details thereof.

Through the above steps, the transistor 160 using the substrate 100 including a semiconductor material is formed (see FIG. 8B). The transistor 160 is capable of high-speed operation. Therefore, when the transistor is used as a reading transistor, data can be read at high speed.

Figure 8C:
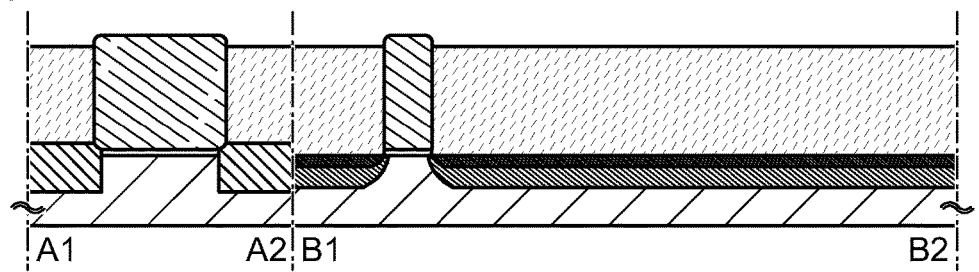

Next, planarization treatment is performed on a surface of the insulating layer 130; thus, the insulating layer 130 partly has a surface with a root-mean-square (RMS) roughness of less than or equal to 1 nm, at least part of a top surface of the gate electrode 110 is exposed, and the part of the top surface of the gate electrode 110 is formed in a higher position than part of the surface of the insulating layer 130 (see FIG. 8C). As the planarization treatment for the insulating layer 130, chemical mechanical polishing (CMP) treatment is performed. Note that the CMP treatment can be performed by a method similar to that described in the above embodiment; therefore, the above embodiment can be referred to for details thereof.

By the above CMP treatment, the root-mean-square (RMS) roughness of at least part of the surface of the insulating layer 130 is preferably made to be less than or equal to 1 nm. The root-mean-square (RMS) roughness of the part of the top surface of the gate electrode 110 is preferably less than or equal to 2 nm.

At this time, the surface of the insulating layer 130 is planarized, at least part of the top surface of the gate electrode 110 is exposed, and the part of the top surface of the gate electrode 110 is formed in a higher position than the part of the surface of the insulating layer 130. Here, the difference in height between the part of the top surface of the gate electrode 110 and the part of the surface of the insulating layer 130 is preferably 0.1 times to 5 times as large as the thickness of the gate insulating layer 146.

Further, when the part of the top surface of the gate electrode 110 is exposed by CMP treatment, an edge portion of the top surface of the gate electrode 110 can be polished and the edge portion of the top surface of the gate electrode 110 can have a smooth shape, preferably a shape having a surface curved smoothly from the surface of the insulating layer 130 to a top end portion of the projecting gate electrode 110. By providing such a smooth curved surface on the top end portion of the gate electrode 110 which projects from the insulating layer 130, the gate electrode 110 and the source electrode 142a can be in close contact with each other without a space therebetween. Accordingly, the contact resistance between the gate electrode 110 and the source electrode 142a can be further reduced. Furthermore, even when the thickness of the source electrode 142a is reduced, disconnection in an intersection with the gate electrode 110 can be prevented.

Note that before or after any of the above steps, a step of forming an additional electrode, wiring, semiconductor layer, insulating layer, or the like may be performed. For example, a multilayer wiring structure in which an insulating layer and a conductive layer are stacked is employed as a structure of a wiring, whereby a highly-integrated semiconductor device can be realized.

In subsequent steps, the transistor 162 can be manufactured by a method similar to the method described in the above embodiment with reference to FIGS. 3C to 3E and FIGS. 4A to 4C. Therefore, the above embodiment can be referred to for details of the subsequent steps. The capacitor 164 can be manufactured in such a manner that the electrode 148b is formed so as to overlap with the source electrode 142a in the formation of the gate electrode 148a described with reference to FIG. 4B.

In the above-described manner, the channel formation region of the transistor 162 can be provided in an extremely flat region whose root-mean-square (RMS) roughness is less than or equal to 1 nm (preferably less than or equal to 0.5 nm). Accordingly, even when the transistor 162 is miniaturized, a problem such as a short-channel effect can be prevented and thus the transistor 162 can have favorable characteristics.

Moreover, by forming the part of the top surface of the gate electrode 110 in a higher position than the part of the surface of the insulating layer 130, a reduction in the area of a portion where the gate electrode 110 is in contact with the source electrode 142a can be prevented; thus the contact resistance between the gate electrode 110 and the source electrode 142a can be reduced. As a result, the amount of heat generation or power consumption of the transistor 162 which is electrically connected to the transistor 160 can be reduced; accordingly, the transistors can be stacked with the amount of heat generation or power consumption of the transistor suppressed. Consequently, by forming a stacked-layer structure of the miniaturized transistors, three-dimensional high integration of the semiconductor device can be achieved with favorable transistor characteristics maintained.

The structures, methods, and the like described in this embodiment can be combined as appropriate with any of the structures, methods, and the like described in the other embodiments.

Embodiment 3

In this embodiment, an application example of a semiconductor device according to an embodiment of the disclosed invention will be described with reference to FIGS. 9A to 9C. Here, an example of a memory device will be described. Note that in circuit diagrams, "OS" may be written beside a transistor in order to indicate that the transistor includes an oxide semiconductor.

Figure 9A:
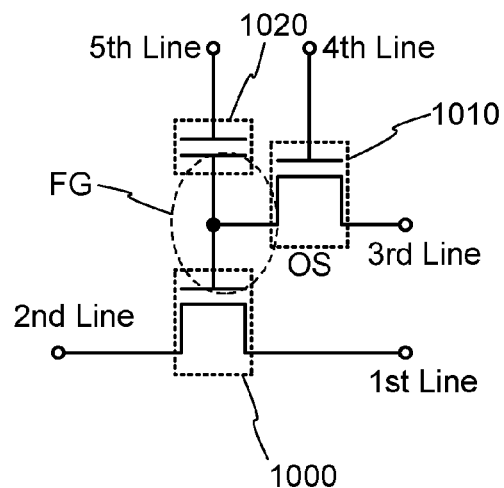
FIGS. 9A to 9C are diagrams illustrating application examples of a semiconductor device.

In the semiconductor device illustrated in FIG. 9A, which can be used as a memory device, a first wiring (1st Line) is electrically connected to a source electrode of a transistor 1000, and a second wiring (2nd Line) is electrically connected to a drain electrode of the transistor 1000. A gate electrode of the transistor 1000 and one of a source electrode and a drain electrode of a transistor 1010 are electrically connected to one electrode of a capacitor 1020. A third wiring (3rd Line) and the other of the source electrode and the drain electrode of the transistor 1010 are electrically connected to each other, and a fourth wiring (4th Line) and a gate electrode of the transistor 1010 are electrically connected to each other. Further, a fifth wiring (5th Line) is electrically connected to the other electrode of the capacitor 1020.

Here, a transistor including an oxide semiconductor is used as the transistor 1010. Here, as the transistor including an oxide semiconductor, for example, the transistor described in the above embodiment can be used. A transistor including an oxide semiconductor has a characteristic of extremely small off-state current. Therefore, when the transistor 1010 is turned off, the potential of the gate electrode of the transistor 1000 can be held for an extremely long time. Moreover, by using the transistor described in the above embodiment, a short-channel effect of the transistor 1010 can be suppressed and miniaturization thereof can be achieved. By providing the capacitor 1020, holding of charge given to the gate electrode of the transistor 1000 and reading of stored data can be easily performed. Here, as the capacitor 1020, for example, the capacitor described in the above embodiment can be used.

Further, a transistor including a semiconductor material other than an oxide semiconductor is used as the transistor 1000. The semiconductor material other than an oxide semiconductor can be silicon, germanium, silicon germanium, silicon carbide, gallium arsenide, or the like, for example, and is preferably a single crystal semiconductor. Alternatively, an organic semiconductor material or the like may be used. A transistor including such a semiconductor material can easily operate at high speed. Here, as the transistor including a semiconductor material other than an oxide semiconductor, for example, the transistor described in the above embodiment can be used.

Here, the gate electrode of the transistor 1000 and the source electrode (drain electrode in some cases) of the transistor 1010 are electrically connected to each other to have a structure similar to that described in the above embodiment, whereby the amount of heat generation or power consumption of the transistor 1010 which is electrically connected to the transistor 1000 can be reduced; accordingly, the transistors can be stacked with the amount of heat generation or power consumption of the transistor suppressed. Consequently, by forming a stacked-layer structure of the miniaturized transistors, three-dimensional high integration of the semiconductor device can be achieved with favorable transistor characteristics maintained.

Figure 9C:
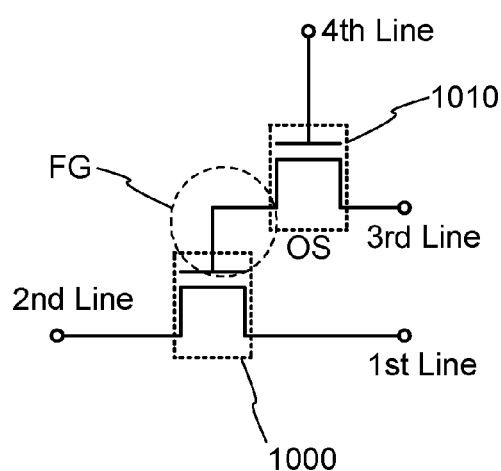

Further, as illustrated in FIG. 9C, a structure in which the capacitor 1020 is not provided may also be employed.

In the semiconductor device illustrated in FIG. 9A, writing, storing, and reading of data can be performed in the following manner, utilizing the advantage in that the potential of the gate electrode of the transistor 1000 can be held.

Firstly, writing and holding of data will be described. First, the potential of the fourth wiring is set to a potential at which the transistor 1010 is turned on, so that the transistor 1010 is turned on. Accordingly, the potential of the third wiring is supplied to the gate electrode of the transistor 1000 and the capacitor 1020. That is, predetermined charge is given to the gate electrode of the transistor 1000 (writing). Here, one of charges for supply of two different potentials (hereinafter, charge for supply of a low potential is referred to as charge $Q_L$ and charge for supply of a high potential is referred to as charge $Q_H$) is given. Note that charges giving three or more different potentials may be applied to increase storage capacity. After that, the potential of the fourth wiring is set to a potential at which the transistor 1010 is turned off, so that the transistor 1010 is turned off. Thus, the charge given to the gate electrode of the transistor 1000 is held (storing).

Since the off-state current of the transistor 1010 is extremely small, the charge of the gate electrode of the transistor 1000 is held for a long time.

Secondly, reading of data will be described. By supplying an appropriate potential (reading potential) to the fifth wiring when a predetermined potential (constant potential) is supplied to the first wiring, the potential of the second wiring varies depending on the amount of charge held in the gate electrode of the transistor 1000. This is because in general, when the transistor 1000 is an n-channel transistor, apparent threshold voltage $V_{th\_H}$ in the case where $Q_H$ is given to the gate electrode of the transistor 1000 is lower than apparent threshold voltage $V_{th\_L}$ in the case where $Q_L$ is given to the gate electrode of the transistor 1000. Here, apparent threshold voltage refers to the potential of the fifth wiring, which is needed to turn on the transistor 1000. Thus, the potential of the fifth wiring is set to a potential $V_0$ intermediate between $V_{th\_H}$ and $V_{th\_L}$, whereby charge given to the gate electrode of the transistor 1000 can be determined. For example, in the case where $Q_H$ is given in writing, when the potential of the fifth wiring is set to $V_0$ ($>V_{th\_H}$), the transistor 1000 is turned on. In the case where $Q_L$ is given in writing, even when the potential of the fifth wiring is set to $V_0$ ($<V_{th\_L}$), the transistor 1000 remains in an off state. Therefore, the stored data can be read by measuring the potential of the second wiring.

Note that in the case where memory cells are arrayed to be used, only data of desired memory cells need to be read. Thus, in the case where data of predetermined memory cells is read and data of the other memory cells is not read, a potential at which the transistor 1000 is turned off regardless of the state of the gate electrode, that is, a potential lower than $V_{th\_H}$ may be supplied to fifth wirings of the memory cells whose data is not to be read. Alternatively, a potential at which the transistor 1000 is turned on regardless of the state of the gate electrode, that is, a potential higher than $V_{th\_L}$ may be supplied to the fifth wirings.

Thirdly, rewriting of data will be described. Rewriting of data is performed in a manner similar to that of the writing and storing of data. Specifically, the potential of the fourth wiring is set to a potential at which the transistor 1010 is turned on, so that the transistor 1010 is turned on. Accordingly, the potential of the third wiring (potential for new data) is supplied to the gate electrode of the transistor 1000 and the capacitor 1020. After that, the potential of the fourth wiring is set to a potential at which the transistor 1010 is turned off, so that the transistor 1010 is turned off. Accordingly, charge for new data is given to the gate electrode of the transistor 1000.

In the semiconductor device according to the disclosed invention, data can be directly rewritten by another writing of data as described above. Therefore, extracting of charge from a floating gate with the use of high voltage, which is needed in a flash memory or the like, is not necessary and thus a reduction in operation speed, which is attributed to erasing operation, can be suppressed. In other words, high-speed operation of the semiconductor device is realized.

Note that the source electrode or the drain electrode of the transistor 1010 is electrically connected to the gate electrode of the transistor 1000, thereby having an effect similar to that of a floating gate of a floating gate transistor used for a nonvolatile memory element. Therefore, a portion in the drawing where the source electrode or the drain electrode of the transistor 1010 is electrically connected to the gate electrode of the transistor 1000 is called a floating gate portion FG in some cases. When the transistor 1010 is off, the floating gate portion FG can be regarded as being embedded in an insulator and thus charge is held in the floating gate portion FG. The amount of off-state current of the transistor 1010 including an oxide semiconductor is less than or equal to one hundred thousandth of the amount of off-state current of a transistor including a silicon semiconductor or the like; thus, loss of charge accumulated in the floating gate portion FG due to leakage current of the transistor 1010 is negligible. That is, with the transistor 1010 including an oxide semiconductor, a nonvolatile memory device which can store data without being supplied with power can be realized.

For example, when the off-state current of the transistor 1010 at room temperature is less than or equal to 10 zA/μm (1 zA (zeptoampere) is $1\times10^{-21}$ A) and the capacitance of the capacitor 1020 is approximately 10 fF, data can be stored for $10^4$ seconds or longer. Needless to say, the storage time depends on transistor characteristics and the capacitance.

Further, in that case, the problem of deterioration of a gate insulating film (tunnel insulating film), which is pointed out in a conventional floating gate transistor, does not exist. That is to say, the deterioration of a gate insulating film due to injection of an electron into a floating gate, which has been conventionally regarded as a problem, can be neglected. This means that there is no limit on the number of times of writing in principle. Furthermore, high voltage needed for writing or erasing in a conventional floating gate transistor is not necessary.

Figure 9B:
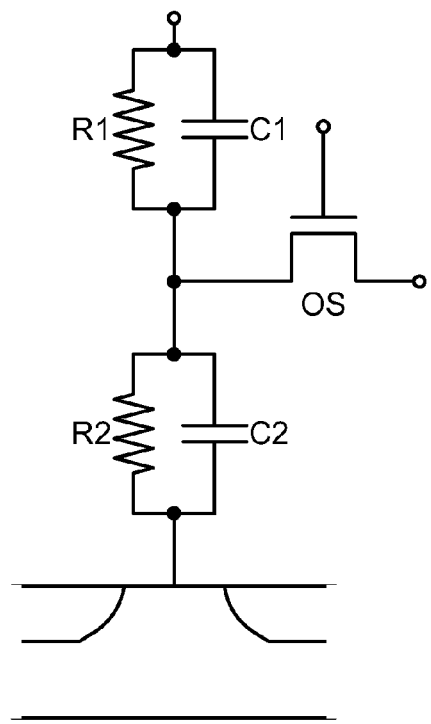

The components such as transistors in the semiconductor device in FIG. 9A can be regarded as including a resistor and a capacitor as illustrated in FIG. 9B. That is, in FIG. 9B, the transistor 1000 and the capacitor 1020 are each regarded as including a resistor and a capacitor. R1 and C1 denote the resistance and the capacitance of the capacitor 1020, respectively. The resistance R1 corresponds to the resistance of an insulating layer included in the capacitor 1020. R2 and C2 denote the resistance and the capacitance of the transistor 1000, respectively. The resistance R2 corresponds to the resistance of a gate insulating layer at the time when the transistor 1000 is on. The capacitance C2 corresponds to so-called gate capacitance (capacitance formed between the gate electrode and the source or drain electrode, and capacitance formed between the gate electrode and a channel formation region).

The resistance (also referred to as effective resistance) between the source electrode and the drain electrode in the case where the transistor 1010 is off is denoted by ROS. When R1 and R2 satisfy the relations of R1≥ROS and R2≥ROS under the condition where gate leakage of the transistor 1010 is sufficiently small, a charge holding period (also referred to as a data storage period) is determined mainly by the off-state current of the transistor 1010.

On the other hand, when the conditions are not satisfied, it is difficult to sufficiently secure the holding period even if the off-state current of the transistor 1010 is small enough. This is because leakage current other than the off-state current of the transistor 1010 (e.g., leakage current generated between the source electrode and the gate electrode) is large. Thus, it can be said that the semiconductor device disclosed in this embodiment preferably satisfies the above relations.

It is preferable that C1≥C2 be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be reduced.

When the above relation is satisfied, a more favorable semiconductor device can be realized. Note that R1 and R2 are controlled by the gate insulating layer of the transistor 1000 and the insulating layer of the capacitor 1020. The same relation is applied to C1 and C2. Therefore, it is preferable that the material, the thickness, and the like of the gate insulating layer be set as appropriate to satisfy the above relation.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since voltage applied to a control gate is high, it is necessary to keep a proper distance between cells in order to prevent the potential from affecting a floating gate of the adjacent cell. This is one of factors inhibiting high integration of the semiconductor device. The factor is attributed to a basic principle of a flash memory, in which tunneling current is generated by application of a high electric field.

Further, because of the above principle of a flash memory, deterioration of an insulating film proceeds and thus another problem of the limit on the number of times of rewriting (approximately $10^4$ times to $10^5$ times) occurs.

The semiconductor device according to the disclosed invention is operated by switching of a transistor including an oxide semiconductor and does not use the above-described principle of charge injection by tunneling current. That is, a high electric field for charge injection is not necessary unlike a flash memory. Accordingly, it is not necessary to consider an influence of a high electric field from a control gate on an adjacent cell, which facilitates high integration.

Further, charge injection by tunneling current is not utilized, which means that there are no causes for deterioration of a memory cell. In other words, the semiconductor device according to the disclosed invention has higher durability and reliability than a flash memory.

In addition, the semiconductor device according to the disclosed invention is advantageous over a flash memory in that a high electric field is not necessary and a large peripheral circuit (such as a booster circuit) is not necessary.

In the case where the relative permittivity $\epsilon r1$ of the insulating layer included in the capacitor 1020 is different from the relative permittivity $\epsilon r2$ of the insulating layer included in the transistor 1000, it is easy to satisfy C1≥C2 while 2·S2≥S1 (preferably S2≥S1) is satisfied where S1 is the area of the insulating layer included in the capacitor 1020 and S2 is the area of the insulating layer included in the gate capacitor of the transistor 1000. In other words, C1≥C2 can be easily satisfied while the area of the insulating layer included in the capacitor 1020 is small. Specifically, for example, a film formed of a high-k material such as hafnium oxide or a stack of a film formed of a high-k material such as hafnium oxide and a film formed of an oxide semiconductor is used for the insulating layer included in the capacitor 1020 so that ∈r1 can be 10 or more, preferably 15 or more, and silicon oxide is used for the insulating layer included in the gate capacitor so that ∈r2 can be 3 to 4.

Combination of such structures enables higher integration of the semiconductor device according to the disclosed invention.

Note that an n-channel transistor in which electrons are majority carriers is used in the above description; needless to say, a p-channel transistor in which holes are majority carriers can be used instead of the n-channel transistor.

As described above, the semiconductor device according to an embodiment of the disclosed invention has a nonvolatile memory cell which includes a writing transistor where leakage current (off-state current) between a source and a drain in an off state is small, a reading transistor including a semiconductor material different from that of the writing transistor, and a capacitor.

In the case of using a general silicon semiconductor, it is difficult to reduce the leakage current (off-state current) at a temperature at which a transistor is used (e.g., 25° C.) to approximately less than 100 zA (1×10$^{-19}$ A); however, the above characteristic can be obtained in a transistor manufactured by processing an oxide semiconductor under appropriate conditions. Therefore, a transistor including an oxide semiconductor is preferably used as the writing transistor.

In addition, a transistor including an oxide semiconductor has a small subthreshold swing (S value); thus, the switching rate can be sufficiently high even if mobility is comparatively low. Therefore, by using the transistor as the writing transistor, rising of a writing pulse given to the floating gate portion FG can be very sharp. Further, the off-state current is small and thus the amount of charge held in the floating gate portion FG can be reduced. That is, by using the transistor including an oxide semiconductor as the writing transistor, rewriting of data can be performed at high speed.

As for the reading transistor, although there is no limitation on off-state current, it is preferable to use a transistor which operates at high speed in order to increase the reading rate. For example, a transistor with a switching rate of 1 nanosecond or lower is preferably used as the reading transistor.

In this manner, when a transistor including an oxide semiconductor is used as a writing transistor and a transistor including a semiconductor material other than an oxide semiconductor is used as a reading transistor, a semiconductor device capable of storing data for a long time and reading data at high speed, which can be used as a memory device, can be obtained.

Moreover, by using the transistor described in the above embodiment as the writing transistor, a short-channel effect of the writing transistor can be suppressed and miniaturization thereof can be achieved. Accordingly, high integration of the semiconductor device which can be used as a memory device can be achieved.

Further, the gate electrode of the reading transistor and the source electrode of the writing transistor are electrically connected to each other to have a structure similar to that described in the above embodiment, whereby the amount of heat generation or power consumption of the writing transistor which is electrically connected to the reading transistor can be reduced; accordingly, the transistors can be stacked with the amount of heat generation or power consumption of the transistor suppressed. Consequently, by forming a stacked-layer structure of the miniaturized transistors, three-dimensional high integration of the semiconductor device can be achieved with favorable transistor characteristics maintained.

The structures, methods, and the like described in this embodiment can be combined as appropriate with any of the structures, methods, and the like described in the other embodiments.

Embodiment 4

In this embodiment, an application example of a semiconductor device according to an embodiment of the disclosed invention will be described with reference to FIGS. 10A and 10B and FIGS. 11A to 11C. Here, an example of a memory device will be described. Note that in circuit diagrams, "OS" may be written beside a transistor in order to indicate that the transistor includes an oxide semiconductor.

Figure 10A:
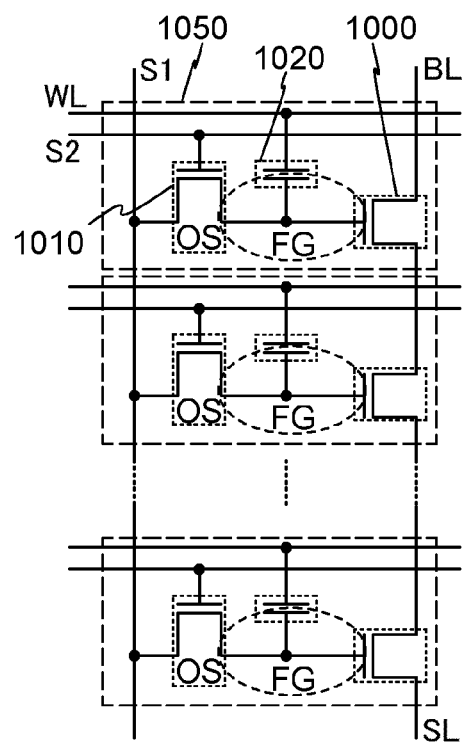
FIGS. 10A and 10B are diagrams illustrating application examples of a semiconductor device.
Figure 10B:
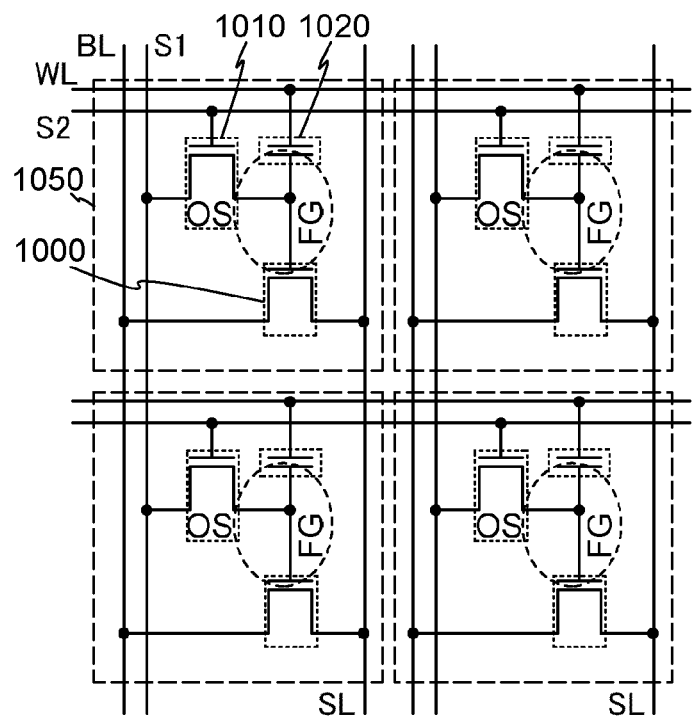

FIGS. 10A and 10B are circuit diagrams of semiconductor devices each of which includes a plurality of semiconductor devices (hereinafter also referred to as memory cells 1050) illustrated in FIG. 9A and can be used as a memory device. FIG. 10A is a circuit diagram of a so-called NAND semiconductor device in which the memory cells 1050 are connected in series, and FIG. 10B is a circuit diagram of a so-called NOR semiconductor device in which the memory cells 1050 are connected in parallel.

The semiconductor device in FIG. 10A includes a source line SL, a bit line BL, a first signal line S1, a plurality of second signal lines S2, a plurality of word lines WL, and a plurality of memory cells 1050. In FIG. 10A, one source line SL and one bit line BL are provided; however, an embodiment of the disclosed invention is not limited to this. A plurality of source lines SL and a plurality of bit lines BL may be provided.

In each of the memory cells 1050, a gate electrode of the transistor 1000, one of a source electrode and a drain electrode of the transistor 1010, and one electrode of the capacitor 1020 are electrically connected to one another. The first signal line S1 and the other of the source electrode and the drain electrode of the transistor 1010 are electrically connected to each other, and the second signal line S2 and a gate electrode of the transistor 1010 are electrically connected to each other. The word line WL and the other electrode of the capacitor 1020 are electrically connected to each other.

Further, a source electrode of the transistor 1000 included in the memory cell 1050 is electrically connected to a drain electrode of the transistor 1000 in the adjacent memory cell 1050. The drain electrode of the transistor 1000 included in the memory cell 1050 is electrically connected to the source electrode of the transistor 1000 in the adjacent memory cell 1050. Note that the drain electrode of the transistor 1000 included in the memory cell 1050 of the plurality of memory cells connected in series, which is provided at one end, is electrically connected to the bit line. The source electrode of the transistor 1000 included in the memory cell 1050 of the plurality of memory cells connected in series, which is provided at the other end, is electrically connected to the source line.

In the semiconductor device in FIG. 10A, writing operation and reading operation are performed for each row. The writing operation is performed as follows. A potential at which the transistor 1010 is turned on is supplied to the second signal line S2 in a row where writing is performed, so that the transistor 1010 in the row where writing is performed is turned on. Accordingly, the potential of the first signal line S1 is supplied to the gate electrode of the transistor 1000 of the specified row, whereby predetermined charge is given to the gate electrode. Thus, data can be written to the memory cell of the specified row.

Further, the reading operation is performed as follows. First, a potential at which the transistor 1000 is turned on regardless of charge given to the gate electrode of the transistor 1000 is supplied to the word lines WL of rows other than a row where reading is performed, whereby the transistors 1000 of the rows other than the row where reading is performed are turned on. Then, a potential (reading potential) at which an on state or an off state of the transistor 1000 is determined depending on charge in the gate electrode of the transistor 1000 is supplied to the word line WL of the row where reading is performed. After that, a constant potential is supplied to the source line SL so that a reading circuit (not shown) connected to the bit line BL is operated. Here, the plurality of transistors 1000 between the source line SL and the bit line BL are on except the transistor 1000 of the row where reading is performed; therefore, conductance between the source line SL and the bit line BL is determined by the state (an on state or an off state) of the transistor 1000 of the row where reading is performed. The conductance of the transistor 1000 of the row where reading is performed depends on charge in the gate electrode thereof. Thus, the potential of the bit line BL varies accordingly. By reading the potential of the bit line with the reading circuit, data can be read from the memory cell of the specified row.

The semiconductor device in FIG. 10B includes a plurality of source lines SL, a plurality of bit lines BL, a plurality of first signal lines S1, a plurality of second signal lines S2, a plurality of word lines WL, and a plurality of memory cells 1050. A gate electrode of the transistor 1000, one of a source electrode and a drain electrode of the transistor 1010, and one electrode of the capacitor 1020 are electrically connected to one another. The source line SL and a source electrode of the transistor 1000 are electrically connected to each other. The bit line BL and a drain electrode of the transistor 1000 are electrically connected to each other. The first signal line S1 and the other of the source electrode and the drain electrode of the transistor 1010 are electrically connected to each other, and the second signal line S2 and a gate electrode of the transistor 1010 are electrically connected to each other. The word line WL and the other electrode of the capacitor 1020 are electrically connected to each other.

In the semiconductor device in FIG. 10B, writing operation and reading operation are performed for each row. The writing operation is performed in a manner similar to that of the semiconductor device in FIG. 10A. The reading operation is performed as follows. First, a potential at which the transistor 1000 is turned off regardless of charge given to the gate electrode of the transistor 1000 is supplied to the word lines WL of rows other than a row where reading is performed, so that the transistors 1000 of the rows other than the row where reading is performed are turned off. Then, a potential (reading potential) at which an on state or an off state of the transistor 1000 is determined depending on charge in the gate electrode of the transistor 1000 is supplied to the word line WL of the row where reading is performed. After that, a constant potential is supplied to the source lines SL so that a reading circuit (not shown) connected to the bit lines BL is operated. Here, conductance between the source line SL and the bit line BL is determined by the state of the transistor 1000 of the row where reading is performed. That is, the potential of the bit line BL varies depending on charge in the gate electrode of the transistor 1000 of the row where reading is performed. By reading the potential of the bit lines with the reading circuit, data can be read from the memory cells of the specified row.

Although the amount of data which can be stored in each of the memory cells 1050 is one bit in the above description, the structure of the semiconductor device of this embodiment is not limited to this. The amount of data which is stored in each of the memory cells 1050 may be increased by preparing three or more potentials to be supplied to the gate electrode of the transistor 1000. For example, in the case where the number of potentials to be supplied to the gate electrode of the transistor 1000 is four, data of two bits can be stored in each of the memory cells.

Next, an example of a reading circuit which can be used for the semiconductor devices in FIGS. 10A and 10B, or the like will be described with reference to FIGS. 11A to 11C.

Figure 11A:
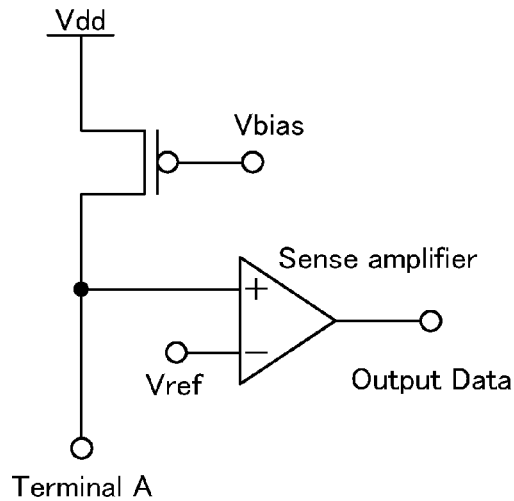
FIGS. 11A to 11C are diagrams illustrating application examples of a semiconductor device.

FIG. 11A illustrates an outline of a reading circuit. The reading circuit includes a transistor and a sense amplifier circuit.

At the time of reading data, a terminal A is connected to a bit line to which a memory cell from which data is read is connected. Further, a bias potential Vbias is applied to a gate electrode of the transistor so that a potential of the terminal A is controlled.

The resistance of the memory cell 1050 varies depending on stored data. Specifically, when the transistor 1000 in the selected memory cell 1050 is on, the memory cell has low resistance, whereas when the transistor 1000 in the selected memory cell 1050 is off, the memory cell has high resistance.

When the memory cell has high resistance, a potential of the terminal A is higher than a reference potential Vref and the sense amplifier circuit outputs a potential corresponding to the potential of the terminal A. On the other hand, when the memory cell has low resistance, the potential of the terminal A is lower than the reference potential Vref and the sense amplifier circuit outputs a potential corresponding to the potential of the terminal A.

Thus, by using the reading circuit, data can be read from the memory cell. Note that the reading circuit of this embodiment is an example. Another circuit may be used. The reading circuit may further include a precharge circuit. Instead of the reference potential Vref, a reference bit line may be connected to the sense amplifier circuit.

Figure 11B:
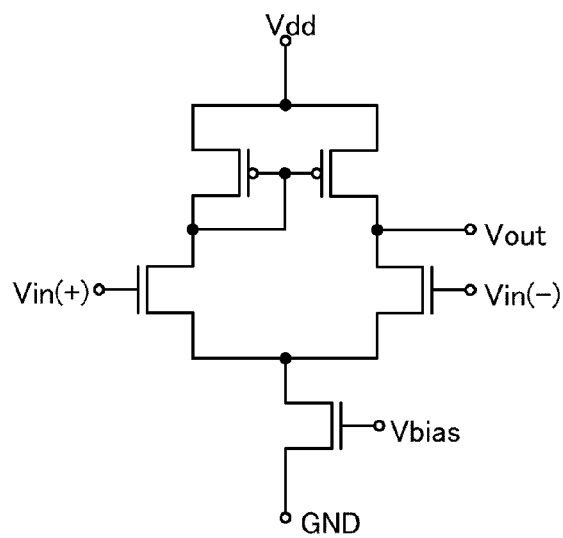

FIG. 11B illustrates a differential sense amplifier which is an example of sense amplifier circuits. The differential sense amplifier has input terminals Vin (+) and Vin (−) and an output terminal Vout and amplifies the potential difference between Vin (+) and Vin (−). If the potential of Vin (+) is higher than the potential of Vin (−), Vout outputs a signal High, whereas if the potential of Vin (+) is lower than the potential of Vin (−), Vout outputs a signal Low. In the case where the differential sense amplifier is used for the reading circuit, one of Vin (+) and Vin (−) is connected to the terminal A, and the reference potential Vref is supplied to the other of Vin (+) and Vin (−).

Figure 11C:
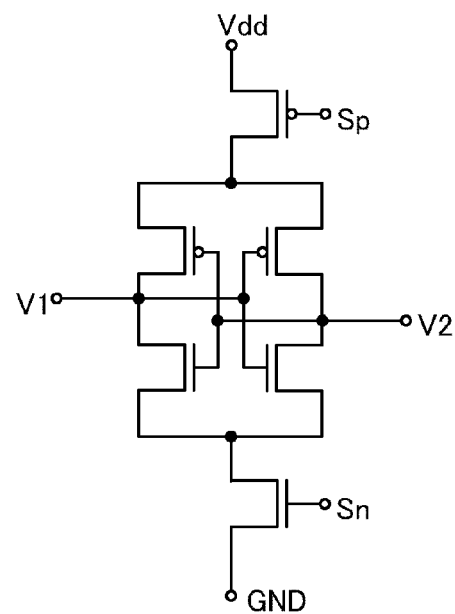

FIG. 11C illustrates a latch sense amplifier which is an example of sense amplifier circuits. The latch sense amplifier has input/output terminals V1 and V2 and input terminals of control signals Sp and Sn. First, the signal Sp is set high and the signal Sn is set low, and a power supply potential (Vdd) is interrupted. Next, a potential to be compared is supplied to each of V1 and V2. After that, when the power supply potential (Vdd) is supplied by setting the signal Sp low and the signal Sn high. An output of V1 is High and an output of V2 is Low when the potential of V1 is higher than the potential of V2. The output of V1 is Low and the output of V2 is High when the potential of V1 is lower than the potential of V2. By utilizing such a relation, the potential difference between V1 and V2 can be amplified. In the case where the latch sense amplifier is used for the reading circuit, one of V1 and V2 is connected to the terminal A and the output terminal through a switch, and the reference potential Vref is supplied to the other of V1 and V2.

In the semiconductor device described above, which can be used as a memory device, the transistor described in the above embodiment is used as the writing transistor of a memory cell, whereby a short-channel effect of the writing transistor can be suppressed and miniaturization thereof can be achieved. Accordingly, high integration of the semiconductor device which can be used as a memory device can be achieved.

Further, the gate electrode of the reading transistor and the source electrode of the writing transistor are electrically connected to each other to have a structure similar to that described in the above embodiment, whereby the amount of heat generation or power consumption of the writing transistor which is electrically connected to the reading transistor can be reduced; accordingly, the transistors can be stacked with the amount of heat generation or power consumption of the transistor suppressed. Consequently, by forming a stacked-layer structure of the miniaturized transistors, three-dimensional high integration of the semiconductor device which can be used as a memory device can be achieved with favorable transistor characteristics maintained.

The structures, methods, and the like described in this embodiment can be combined as appropriate with any of the structures, methods, and the like described in the other embodiments.

Embodiment 5

Figure 12A:
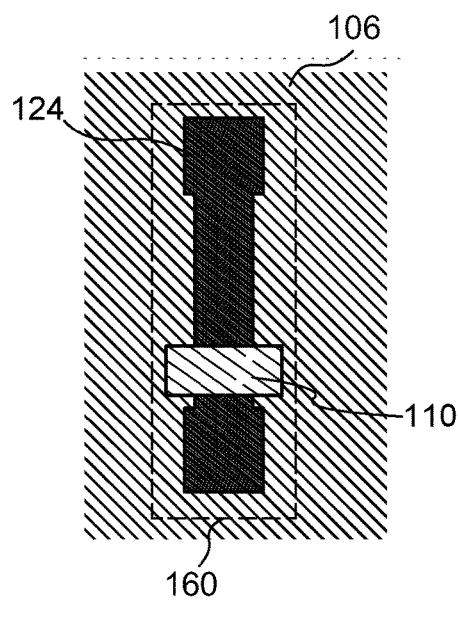
FIGS. 12A to 12D are diagrams illustrating an application example of a semiconductor device.
Figure 12B:
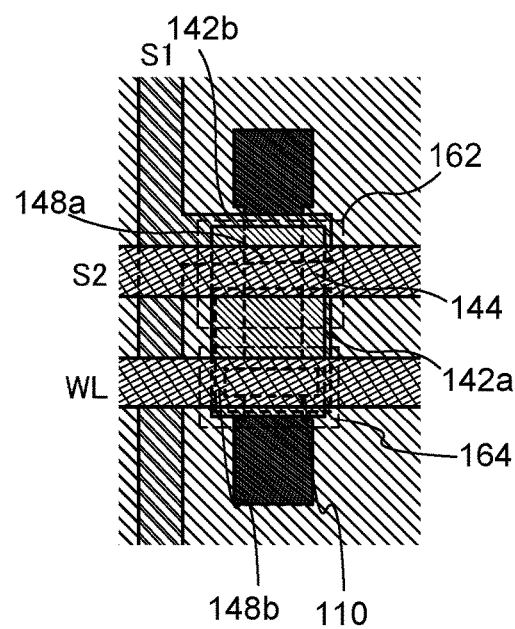
Figure 12C:
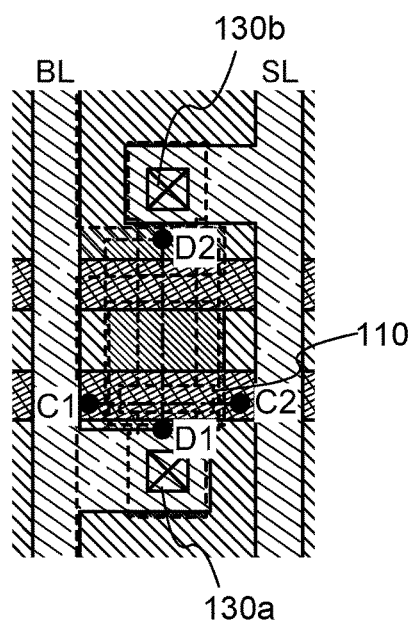
Figure 12D:
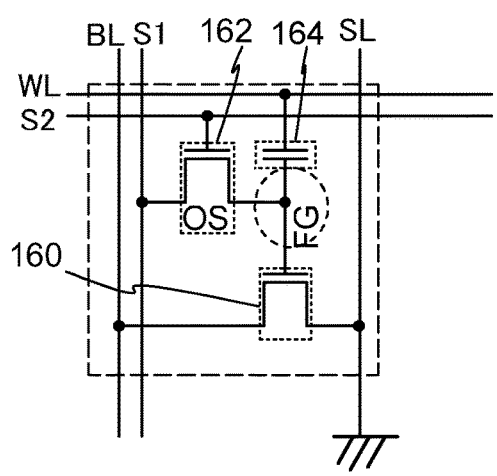

In this embodiment, a structure of a semiconductor device according to an embodiment of the disclosed invention will be described with reference to FIGS. 12A to 12D.
<Planar Structure and Circuit Configuration of Semiconductor Device>
FIGS. 12A to 12C are specific examples of plan views of a memory cell included the semiconductor device described in the above embodiment. FIG. 12D illustrates a circuit configuration of the memory cell. FIGS. 12A to 12C are plan views illustrating three stages of a manufacturing process in order.

The plan view of FIG. 12A illustrates the metal compound region 124 and the gate electrode 110 which are included in the transistor 160. Note that a channel formation region and a gate insulating layer over the channel formation region are provided below the gate electrode 110. The element isolation insulating layer 106 is provided so as to surround the transistor 160.

The plan view of FIG. 12B illustrates the source electrode 142a, the drain electrode 142b, the oxide semiconductor layer 144, and the gate electrode 148a, which are included in the transistor 162; a signal line S1 (142b); a signal line S2 (148a); a word line WL (148b); and the electrode 148b included in the capacitor 164, in addition to the components illustrated in the plan view of FIG. 12A. The source electrode 142a and the drain electrode 142b included in the transistor 162 are formed using the same conductive layer as the signal line S1. Further, the gate electrode 148a included in the transistor 162, the electrode 148b included in the capacitor 164, the signal line S2, and the word line WL are formed using the same conductive layer. Note that in the capacitor 164, the source electrode 142a functions as one electrode and the electrode 148b functions as the other electrode.

The plan view of FIG. 12C illustrates a bit line BL, a source line SL, an opening 130a formed between the bit line BL and the metal compound region 124, and an opening 130b formed between the source line SL and the metal compound region 124, in addition to the components illustrated in the plan view of FIG. 12B.

In the case where the manufacturing method described in Embodiment 2 is employed, FIG. 5A can be referred to for a cross-sectional structure along line C1-C2 and line D1-D2 in FIG. 12C.

FIG. 12D illustrates a circuit configuration of the memory cell, corresponding to the plan views of FIGS. 12A to 12C. The memory cell illustrated in FIG. 12D includes the bit line (BL), the first signal line (S1), the source line (SL), the word line (WL), and the second signal line (S2).

A conductive layer used for forming the source electrode and the drain electrode can be planarized by a CMP process. In the case of performing CMP treatment, the thickness of the conductive layer can be set as appropriate because the surface condition (the planarity of a surface) is hardly influenced by the thickness of the conductive layer. For example, by forming the conductive layer to have a large thickness (e.g., 150 nm to 500 nm), the conductive layer can have lower resistance and can be used for a wiring.

Note that in the case where a CMP process is not performed on the conductive layer used for forming the source electrode and the drain electrode, a structure in which the conductive layer is tapered and the thickness of the conductive layer is reduced so that an oxide semiconductor layer favorably covers the conductive layer can be considered. In that case, the conductive layer has high resistance and thus is not favorable for use as a wiring. Furthermore, the tapered source electrode and drain electrode hinder miniaturization of the transistor 162. In contrast, according to a method for manufacturing a semiconductor device of an embodiment of the present invention, the conductive layer used for forming the source electrode layer and the drain electrode layer is planarized by a CMP process, whereby the source electrode and the drain electrode of the transistor 162 do not need to be tapered and the thickness of the conductive layer can be increased. Accordingly, the transistor 162 can be effectively miniaturized, and the wiring resistance can be reduced by increasing the thickness of the conductive layer.

The plan views of FIGS. 12A to 12C are an example in which the conductive layer used for forming the source electrode 142a is also used as the first signal line (S1). With such a structure, an opening for connection between the first signal line (S1) and the source electrode or the drain electrode is unnecessary and the area of the memory cell can be reduced as compared to the case where the first signal line is formed using another conductive layer. Moreover, the first signal line (S1) and the bit line (BL) are formed using different conductive layers, whereby these wirings can overlap with each other and thus the area can be reduced. Accordingly, by employing such a planar layout, high integration of the semiconductor device is possible.

The structures, methods, and the like described in this embodiment can be combined as appropriate with any of the structures, methods, and the like described in the other embodiments.

Embodiment 6

In this embodiment, an application example of a semiconductor device according to an embodiment of the disclosed invention will be described with reference to FIG. 13. In this embodiment, a central processing unit (CPU) will be described.

Figure 13:
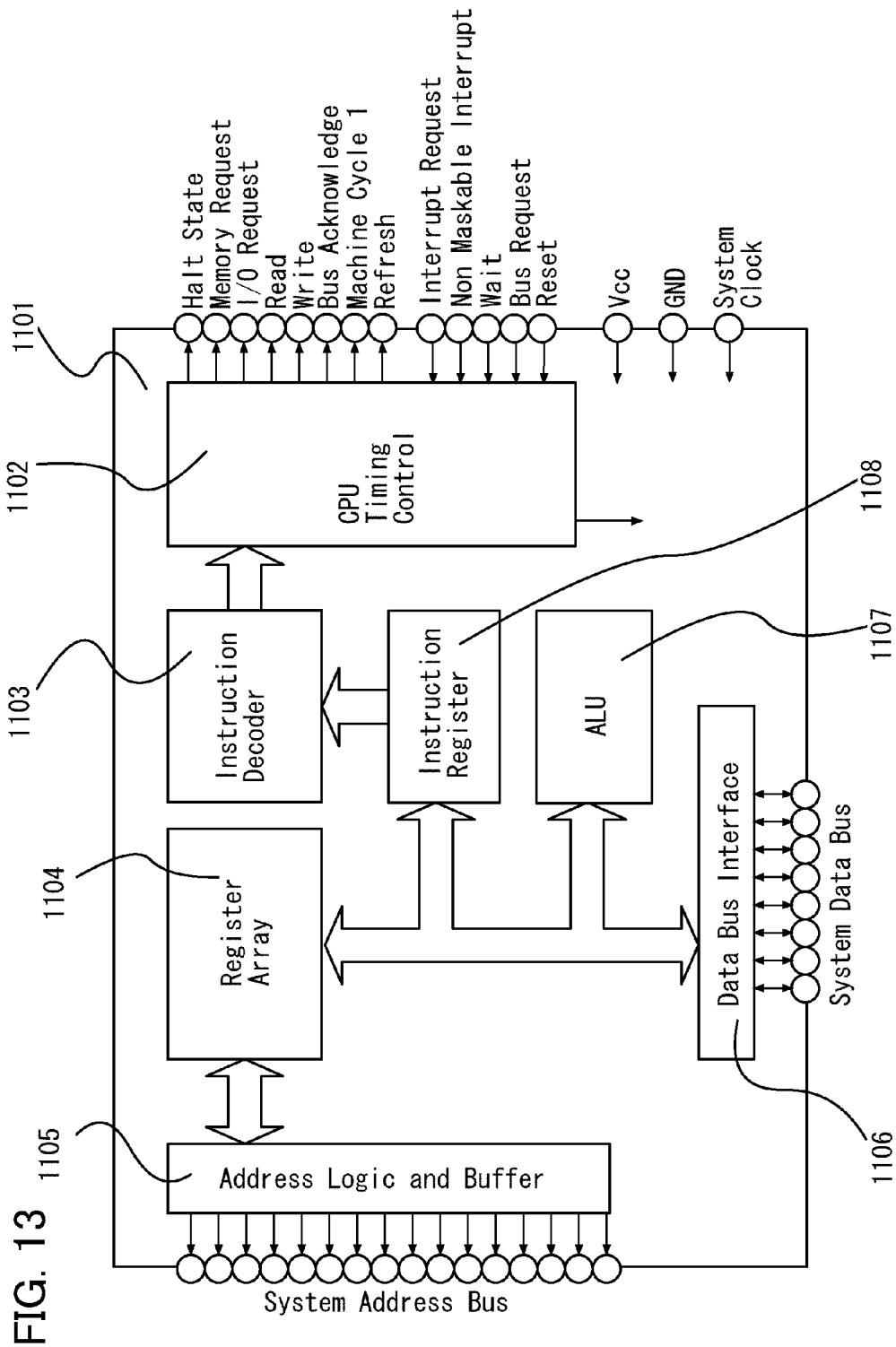
FIG. 13 is a diagram illustrating an application example of a semiconductor device.

FIG. 13 is an example of a block diagram of a CPU. A CPU 1101 illustrated in FIG. 13 includes a timing control circuit 1102, an instruction decoder 1103, a register array 1104, an address logic and buffer circuit 1105, a data bus interface 1106, an ALU (arithmetic logic unit) 1107, an instruction register 1108, and the like.

These circuits are manufactured using the transistor described in the above embodiment, an inverter circuit, a resistor, a capacitor, and the like. Since the off-state current of the transistor described in the above embodiment can be extremely small, lower power consumption of the CPU 1101 can be realized. Moreover, by using the transistor described in the above embodiment, a short-channel effect of the transistor can be suppressed and miniaturization thereof can be achieved.

Each of the circuits included in the CPU 1101 will be briefly described below. The timing control circuit 1102 receives an instruction from the outside, converts the instruction into data for the inside, and sends the data to another block. In addition, the timing control circuit 1102 gives directions such as reading and writing of memory data to the outside in accordance with internal operation. The instruction decoder 1103 has a function of converting an instruction from the outside into an instruction for the inside. The register array 1104 has a function of temporarily storing data. The address logic and buffer circuit 1105 has a function of specifying the address of an external memory. The data bus interface 1106 has a function of taking data in and out of an external memory or a device such as a printer. The ALU 1107 has a function of performing an operation. The instruction register 1108 has a function of temporarily storing an instruction. The CPU includes a combination of such circuits.

By using the transistor described in the above embodiment in at least part of the CPU 1101, a short-channel effect of the transistor can be suppressed and miniaturization thereof can be achieved; accordingly, high integration of the CPU 1101 can be achieved.

Moreover, when a circuit element, a wiring, or the like included in each block of the CPU 1101 is formed by being stacked, the miniaturized transistor is connected to an electrode or a wiring of the circuit element in a manner similar to that described in the above embodiment, whereby the amount of heat generation or power consumption of the miniaturized transistor can be reduced. Consequently, by forming a stacked-layer structure including the miniaturized transistor, three-dimensional high integration of the CPU 1101 can be achieved with favorable transistor characteristics maintained.

The structures, methods, and the like described in this embodiment can be combined as appropriate with any of the structures, methods, and the like described in the other embodiments.

Embodiment 7

In this embodiment, an application example of a semiconductor device according to an embodiment of the disclosed invention will be described with reference to FIGS. 14A and 14B. Here, an example of a semiconductor device having an image sensor function of reading information of an object will be described. Note that in a circuit diagram, "OS" may be written beside a transistor in order to indicate that the transistor includes an oxide semiconductor.

Figure 14A:
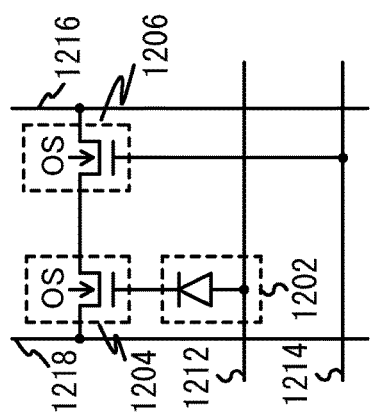
FIGS. 14A and 14B are diagrams illustrating an application example of a semiconductor device.

FIG. 14A illustrates an example of the semiconductor device having an image sensor function. FIG. 14A illustrates an equivalent circuit of a photosensor, and FIG. 14B is a cross-sectional view illustrating part of the photosensor.

One electrode of a photodiode 1202 is electrically connected to a photodiode reset signal line 1212, and the other electrode of the photodiode 1202 is electrically connected to a gate of a transistor 1204. One of a source electrode and a drain electrode of the transistor 1204 is electrically connected to a photosensor reference signal line 1218, and the other of the source electrode and the drain electrode of the transistor 1204 is electrically connected to one of a source electrode and a drain electrode of a transistor 1206. A gate electrode of the transistor 1206 is electrically connected to a gate signal line 1214, and the other of the source electrode and the drain electrode of the transistor 1206 is electrically connected to a photosensor output signal line 1216.

Here, a transistor including an oxide semiconductor is used as the transistors 1204 and 1206 illustrated in FIG. 14A. As the transistor including an oxide semiconductor, the transistor described in the above embodiment can be used. In the transistor described in the above embodiment, leakage current in an off state can be extremely small; therefore, the photodetection accuracy of the photosensor can be improved. Moreover, by using the transistor described in the above embodiment, a short-channel effect of the transistor can be suppressed and miniaturization thereof can be achieved; accordingly, the area of the photodiode can be increased and the photodetection accuracy of the photosensor can be improved.

Figure 14B:
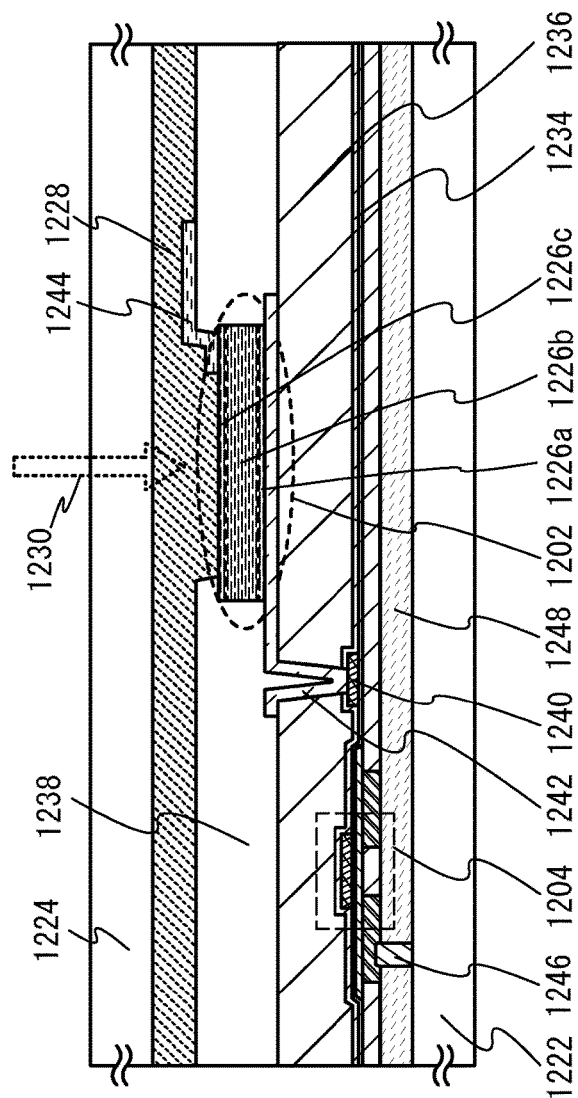

FIG. 14B is a cross-sectional view illustrating the photodiode 1202 and the transistor 1204 in the photosensor. An insulating layer 1248 where a wiring 1246 is embedded is formed over a substrate 1222 (TFT substrate) having an insulating surface, and the photodiode 1202 functioning as a sensor and the transistor 1204 are provided over the insulating layer 1248. A substrate 1224 is provided over the photodiode 1202 and the transistor 1204 with the use of an adhesive layer 1228. Further, an insulating layer 1234, an interlayer insulating layer 1236, and an interlayer insulating layer 1238 are provided over the transistor 1204.

Here, the wiring 1246 is connected to the source electrode or the drain electrode of the transistor 1204 in a manner similar to that described in the above embodiment, whereby the amount of heat generation or power consumption of the miniaturized transistor 1204 can be reduced. Consequently, by forming a stacked-layer structure including the miniaturized transistor, three-dimensional high integration of the photosensor can be achieved with favorable transistor characteristics maintained.

Further, a gate electrode layer 1240 is provided in the same layer as the gate electrode of the transistor 1204 so as to be electrically connected to the gate electrode. The gate electrode layer 1240 is electrically connected to an electrode layer 1242 over the interlayer insulating layer 1236 through an opening provided in the insulating layer 1234 and the interlayer insulating layer 1236. Since the photodiode 1202 is formed over the electrode layer 1242, the photodiode 1202 and the transistor 1204 are electrically connected to each other through the gate electrode layer 1240 and the electrode layer 1242.

The photodiode 1202 has a structure in which a first semiconductor layer 1226a, a second semiconductor layer 1226b, and a third semiconductor layer 1226c are sequentially stacked over the electrode layer 1242. In other words, the photodiode 1202 is electrically connected to the electrode layer 1242 through the first semiconductor layer 1226a. In addition, the photodiode 1202 is electrically connected to an electrode layer 1244 over the interlayer insulating layer 1238 through the third semiconductor layer 1226c.

Here, a pin photodiode in which a semiconductor layer having n-type conductivity as the first semiconductor layer 1226a, a high-resistance semiconductor layer (i-type semiconductor layer) as the second semiconductor layer 1226b, and a semiconductor layer having p-type conductivity as the third semiconductor layer 1226c are stacked is illustrated as an example.

The first semiconductor layer 1226a is an n-type semiconductor layer and is formed using an amorphous silicon film including an impurity element imparting n-type conductivity. The first semiconductor layer 1226a is formed by a plasma CVD method using a semiconductor material gas including an impurity element belonging to Group 15 (e.g., phosphorus (P)). As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not include an impurity element may be formed, and then an impurity element may be introduced into the amorphous silicon film by a diffusion method or an ion implantation method. Heating or the like is preferably performed after introduction of the impurity element by an ion implantation method or the like in order to diffuse the impurity element. In this case, as a method for forming the amorphous silicon film, an LPCVD method, a chemical vapor deposition method, a sputtering method, or the like may be used. The first semiconductor layer 1226a is preferably formed to have a thickness of greater than or equal to 20 nm and less than or equal to 200 nm.

The second semiconductor layer 1226b is an i-type semiconductor layer (intrinsic semiconductor layer) and is formed using an amorphous silicon film. As for formation of the second semiconductor layer 1226b, an amorphous silicon film is formed by a plasma CVD method using a semiconductor material gas. As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. The second semiconductor layer 1226b may be formed by an LPCVD method, a chemical vapor deposition method, a sputtering method, or the like. The second semiconductor layer 1226b is preferably formed to have a thickness of greater than or equal to 200 nm and less than or equal to 1000 nm.

The third semiconductor layer 1226c is a p-type semiconductor layer and can be formed using an amorphous silicon film including an impurity element imparting p-type conductivity. The third semiconductor layer 1226c is formed by a plasma CVD method using a semiconductor material gas including an impurity element belonging to Group 13 (e.g., boron (B)). As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not include an impurity element may be formed, and then an impurity element may be introduced into the amorphous silicon film by a diffusion method or an ion implantation method. Heating or the like is preferably performed after introduction of the impurity element by an ion implantation method or the like in order to diffuse the impurity element. In this case, as a method for forming the amorphous silicon film, an LPCVD method, a chemical vapor deposition method, a sputtering method, or the like may be used. The third semiconductor layer 1226c is preferably formed to have a thickness of greater than or equal to 10 nm and less than or equal to 50 nm.

The first semiconductor layer 1226a, the second semiconductor layer 1226b, and the third semiconductor layer 1226c are not necessarily formed using an amorphous semiconductor, and they may be formed using a polycrystalline semiconductor or a microcrystalline semiconductor (semi-amorphous semiconductor (SAS)).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a lower wavenumber side than 520 cm$^{-1}$, which represents single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon includes hydrogen or halogen at least 1 atomic % or more in order to terminate a dangling bond. Moreover, microcrystalline silicon includes a rare gas element such as helium, argon, krypton, or neon to further promote lattice distortion, so that stability is increased and a favorable microcrystalline semiconductor can be obtained.

This microcrystalline semiconductor film can be formed by a high-frequency plasma CVD method with a frequency of several tens of megahertz to several hundreds of megahertz, or a microwave plasma CVD apparatus with a frequency of 1 GHz or higher. Typically, the microcrystalline semiconductor film can be formed by using a gas obtained by diluting silicon hydride such as SiH$_4$, Si$_2$H$_6$, SiH$_2$Cl$_2$, SiHCl$_3$, SiCl$_4$, or SiF$_4$, with hydrogen. Alternatively, the microcrystalline semiconductor film can be formed by using a gas including silicon hydride and hydrogen which is diluted with one or more rare gas elements selected from helium, argon, krypton, and neon. In this case, the flow rate of hydrogen is set greater than or equal to 5 times and less than or equal to 200 times, preferably greater than or equal to 50 times and less than or equal to 150 times, further preferably 100 times, as high as that of silicon hydride. Further, a carbide gas such as CH$_4$ or C$_2$H$_6$, a germanium gas such as GeH$_4$ or GeF$_4$, F$_2$, or the like may be mixed into the gas including silicon.

In addition, since the mobility of holes generated by the photoelectric effect is lower than that of electrons, a pin photodiode has better characteristics when a surface on the p-type semiconductor layer side is used as a light-receiving plane. An example in which the photodiode 1202 receives incident light 1230 from the substrate 1224 side and converts it into an electric signal is described here. Further, light from the semiconductor layer side, which has a conductivity type opposite to that of the semiconductor layer on the light-receiving plane side, is disturbance light; therefore, the electrode layer 1242 is preferably formed using a light-blocking conductive film. A surface on the n-type semiconductor layer side can alternatively be used as the light-receiving plane.

The incident light 1230 enters from the substrate 1224 side, whereby an oxide semiconductor layer of the transistor 1204 can be shielded from the incident light 1230 by the gate electrode of the transistor 1204.

With the use of an insulating material, the insulating layer 1234, the interlayer insulating layer 1236, and the interlayer insulating layer 1238 can be formed, depending on the material, by a method such as a sputtering method, an SOG method, spin coating, dip coating, spray coating, or a droplet discharge method (such as an ink-jet method, screen printing, or offset printing), or a tool (equipment) such as a doctor knife, a roll coater, a curtain coater, or a knife coater.

As an inorganic insulating material of the insulating layer 1234, a single layer or a stack of any of oxide insulating layers and nitride insulating layers such as a silicon oxide layer, a silicon oxynitride layer, a silicon nitride layer, a silicon nitride oxide layer, an aluminum oxide layer, an aluminum oxynitride layer, an aluminum nitride layer, and an aluminum nitride oxide layer can be used. High-density plasma CVD using microwaves (2.45 GHz) is preferably employed because formation of a dense and high-quality insulating layer having high withstand voltage is possible.

For reduction of surface roughness, an insulating layer functioning as a planarization insulating film is preferably used as the interlayer insulating layer 1236 and the interlayer insulating layer 1238. The interlayer insulating layer 1236 and the interlayer insulating layer 1238 can be formed using an organic insulating material having heat resistance such as polyimide, acrylic, benzocyclobutene, polyamide, or epoxy, for example. Other than such organic insulating materials, it is possible to use a single layer or a stack of a low-dielectric constant material (a low-k material), a siloxane-based resin, phosphosilicate glass (PSG), borophosphosilicate glass (BPSG), or the like.

The photodiode 1202 can read information of an object by detecting the incident light 1230. Note that a light source such as a backlight can be used at the time of reading information of an object.

In the photosensor described above, the transistor described in the above embodiment can be used as the transistor including an oxide semiconductor. In the transistor described in the above embodiment, leakage current in an off state can be extremely small; therefore, the photodetection accuracy of the photosensor can be improved. Moreover, by using the transistor described in the above embodiment, a short-channel effect of the transistor can be suppressed and miniaturization thereof can be achieved; accordingly, the area of the photodiode can be increased and the photodetection accuracy of the photosensor can be improved.

Further, a wiring is connected to a source electrode or a drain electrode of the transistor including an oxide semiconductor in a manner similar to that described in the above embodiment, whereby the amount of heat generation or power consumption of the miniaturized transistor can be reduced. Consequently, by forming a stacked-layer structure including the miniaturized transistor, three-dimensional high integration of the photosensor can be achieved with favorable transistor characteristics maintained.

The structures, methods, and the like described in this embodiment can be combined as appropriate with any of the structures, methods, and the like described in the other embodiments.

Embodiment 8

In this embodiment, the cases where the semiconductor device described in any of the above embodiments is applied to an electronic device will be described with reference to FIGS. 15A to 15F. In this embodiment, the case where the above semiconductor device is applied to an electronic device such as a computer, a mobile phone (also referred to as a cellular phone or a mobile telephone device), a portable information terminal (including a portable game machine, an audio reproducing device, and the like), a digital camera, a digital video camera, electronic paper, or a television device (also referred to as a television or a television receiver).

Figure 15A:
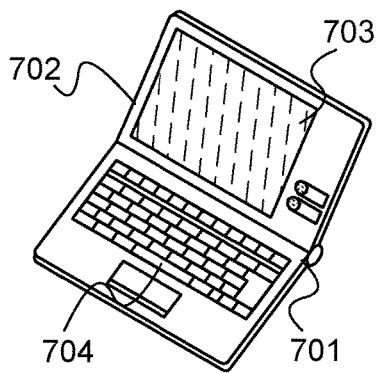
FIGS. 15A to 15F are diagrams each illustrating an electronic device including a semiconductor device.

FIG. 15A illustrates a laptop computer including a housing 701, a housing 702, a display portion 703, a keyboard 704, and the like. The semiconductor device described in any of the above embodiments is provided in at least one of the housing 701 and the housing 702. Therefore, the laptop computer can perform writing and reading of data at high speed, store data for a long time, and have sufficiently low power consumption.

Figure 15D:
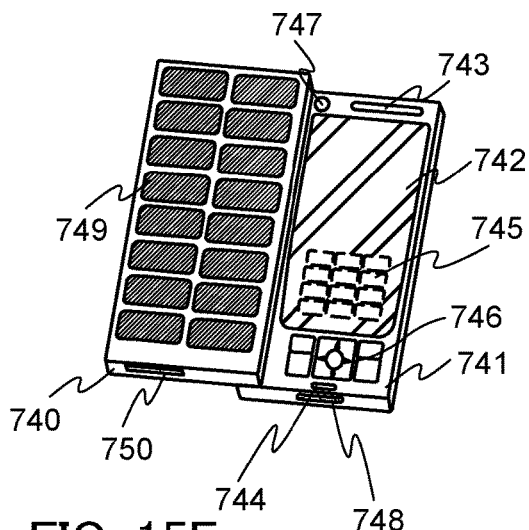
Figure 15B:
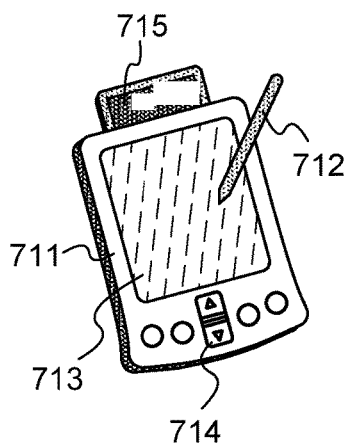

FIG. 15B illustrates a portable information terminal (personal digital assistance (PDA)). A main body 711 is provided with a display portion 713, an external interface 715, operation buttons 714, and the like. Further, a stylus 712 for operating the portable information terminal or the like is provided. The semiconductor device described in any of the above embodiments is provided in the main body 711. Therefore, the portable information terminal can perform writing and reading of data at high speed, store data for a long time, and have sufficiently low power consumption.

Figure 15E:
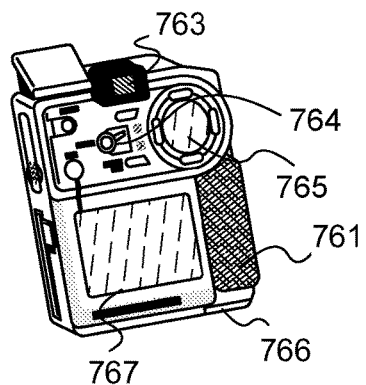
Figure 15C:
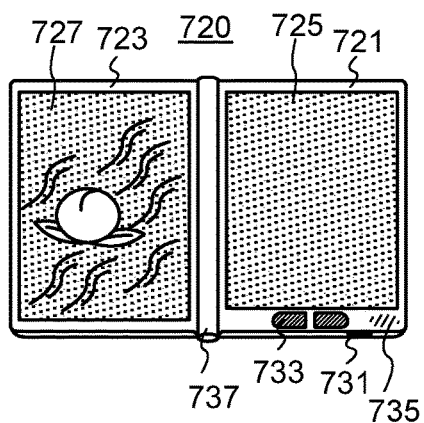

FIG. 15C illustrates an electronic book reader 720 mounting electronic paper. The electronic book reader has two housings of a housing 721 and a housing 723. The housing 721 and the housing 723 are provided with a display portion 725 and a display portion 727, respectively. The housing 721 and the housing 723 are connected by a hinge 737 and can be opened and closed with the hinge 737 as an axis. Further, the housing 721 is provided with a power switch 731, operation keys 733, a speaker 735, and the like. At least one of the housing 721 and the housing 723 is provided with the semiconductor device described in any of the above embodiments. Therefore, the electronic book reader can perform writing and reading of data at high speed, store data for a long time, and have sufficiently low power consumption.

FIG. 15D illustrates a mobile phone including two housings of a housing 740 and a housing 741. Further, the housing 740 and the housing 741 in a state where they are developed as illustrated in FIG. 15D can shift by sliding so that one is lapped over the other; therefore, the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 that charges the mobile phone, an external memory slot 750, and the like. Further, an antenna is incorporated in the housing 741. At least one of the housing 740 and the housing 741 is provided with the semiconductor device described in any of the above embodiments. Therefore, the mobile phone can perform writing and reading of data at high speed, store data for a long time, and have sufficiently low power consumption.

FIG. 15E illustrates a digital camera including a main body 761, a display portion 767, an eyepiece 763, an operation switch 764, a display portion 765, a battery 766, and the like. The semiconductor device described in any of the above embodiments is provided in the main body 761. Therefore, the digital camera can perform writing and reading of data at high speed, store data for a long time, and have sufficiently low power consumption.

Figure 15F:
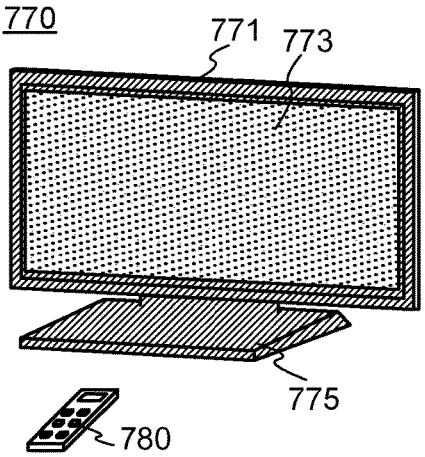

FIG. 15F illustrates a television device 770 including a housing 771, a display portion 773, a stand 775, and the like. The television device 770 can be operated by a switch of the housing 771 or a remote controller 780. The semiconductor devices described in any of the above embodiments are provided for the housing 771 and the remote controller 780. Therefore, the television device can perform writing and reading of data at high speed, store data for a long time, and have sufficiently low power consumption.

Thus, the semiconductor devices according to any of the above embodiments are provided for the electronic devices described in this embodiment. Accordingly, electronic devices with low power consumption can be realized.

This application is based on Japanese Patent Application serial no. 2010-056758 filed with Japan Patent Office on Mar. 12, 2010, the entire contents of which are hereby incorporated by reference.

The invention claimed is:

1. A semiconductor device comprising:
an insulating layer;
a wiring embedded in the insulating layer;
a semiconductor layer over the insulating layer;
a source electrode and a drain electrode electrically connected to the semiconductor layer, the source electrode and the drain electrode being in contact with the insulating layer;
a gate electrode overlapping with the semiconductor layer; and
a gate insulating layer between the semiconductor layer and the gate electrode,
wherein a part of the wiring is projected from the insulating layer, and
wherein the part of the wiring is in direct contact with the source electrode or the drain electrode.

2. The semiconductor device according to claim 1, wherein the insulating layer comprises an inorganic insulating material.

3. The semiconductor device according to claim 1, wherein the semiconductor layer is an oxide semiconductor layer.

4. A semiconductor device comprising:
an insulating layer;
a wiring embedded in the insulating layer;
a semiconductor layer over the insulating layer;
a source electrode and a drain electrode electrically connected to the semiconductor layer;
a gate electrode overlapping with the semiconductor layer; and
a gate insulating layer between the semiconductor layer and the gate electrode,
wherein at least a part of a top surface of the wiring is projected from the insulating layer,
wherein the part of the top surface of the wiring is positioned higher than a part of a surface of the insulating layer and is in direct contact with the source electrode or the drain electrode, and
wherein a root-mean-square roughness of a region which is the part of the surface of the insulating layer and is in contact with the semiconductor layer is less than or equal to 1 nm.

5. The semiconductor device according to claim 4, wherein a part of a side surface of the wiring is exposed.

6. The semiconductor device according to claim 4, wherein the semiconductor layer is an oxide semiconductor layer.

7. A semiconductor device comprising:
an insulating layer;
a wiring embedded in the insulating layer;
a semiconductor layer over the insulating layer;
a source electrode and a drain electrode electrically connected to the semiconductor layer;
a gate electrode overlapping with the semiconductor layer; and
a gate insulating layer between the semiconductor layer and the gate electrode,
wherein at least a part of a top surface of the wiring is projected from the insulating layer,
wherein the part of the top surface of the wiring is positioned higher than a part of a surface of the insulating layer and electrically connected to the gate electrode, and
wherein a root-mean-square roughness of a region which is the part of the surface of the insulating layer and is in contact with the semiconductor layer is less than or equal to 1 nm.

8. The semiconductor device according to claim 7, wherein a part of a side surface of the wiring is exposed.

9. The semiconductor device according to claim 7, wherein the semiconductor layer is an oxide semiconductor layer.

10. A semiconductor device comprising:
a first insulating layer;
a wiring embedded in the first insulating layer;
a second insulating layer over the first insulating layer;
a source electrode and a drain electrode embedded in the second insulating layer;
an oxide semiconductor layer partly in contact with a surface of the second insulating layer, a surface of the source electrode, and a surface of the drain electrode;
a gate insulating layer covering the oxide semiconductor layer; and
a gate electrode over the gate insulating layer to overlap with the oxide semiconductor layer,
wherein the first insulating layer is formed so that at least a part of a top surface of the wiring is exposed,
wherein the part of the top surface of the wiring is positioned higher than a part of a surface of the first insulating layer,
wherein the wiring in a region exposed from the first insulating layer is electrically connected to the source electrode or the drain electrode, and
wherein a root-mean-square roughness of a region which is the part of the surface of the second insulating layer and is in contact with the oxide semiconductor layer is less than or equal to 1 nm.

11. The semiconductor device according to claim 10, wherein a part of a side surface of the wiring is exposed.

12. A semiconductor device comprising:
a first transistor;
an insulating layer over the first transistor; and
a second transistor over the first transistor with the insulating layer positioned therebetween, wherein the first transistor comprises:
  a first channel formation region;
  a first gate insulating layer over the first channel formation region;
  a first gate electrode over the first gate insulating layer to overlap with the first channel formation region; and
  a first source electrode and a first drain electrode electrically connected to the first channel formation region,
wherein the second transistor comprises:
  a second channel formation region comprising an oxide semiconductor layer;
  a second source electrode and a second drain electrode electrically connected to the second channel formation region;
  a second gate electrode overlapping with the second channel formation region; and
  a second gate insulating layer between the second channel formation region and the second gate electrode,
wherein the insulating layer is over the first transistor so that at least a part of a top surface of the first gate electrode is exposed,
wherein the part of the top surface of the first gate electrode is positioned higher than a part of a surface of the insulating layer,
wherein the first gate electrode in a region exposed from the insulating layer is electrically connected to the second source electrode or the second drain electrode, and
wherein a root-mean-square roughness of a region which is the part of the surface of the insulating layer and is in contact with the second channel formation region is less than or equal to 1 nm.

13. The semiconductor device according to claim 12,
wherein part of a side surface of the first gate electrode is exposed.

14. The semiconductor device according to claim 12,
wherein the first channel formation region and the second channel formation region comprise different semiconductor materials.

15. A semiconductor device comprising:
a first transistor;
a first insulating layer over the first transistor; and
a second transistor over the first transistor with the first insulating layer positioned therebetween,
wherein the first transistor comprises:
  a first channel formation region;
  a first gate insulating layer over the first channel formation region;
  a first gate electrode over the first gate insulating layer to overlap with the first channel formation region; and
  a first source electrode and a first drain electrode electrically connected to the first channel formation region,
wherein the second transistor comprises:
  a second source electrode and a second drain electrode embedded in a second insulating layer;
  a second channel formation region which is partly in contact with a surface of the second insulating layer, a surface of the second source electrode, and a surface of the second drain electrode and comprises an oxide semiconductor layer;
  a second gate insulating layer covering the second channel formation region; and
  a second gate electrode over the second gate insulating layer to overlap with the second channel formation region,
wherein the first insulating layer is over the first transistor so that at least a part of a top surface of the first gate electrode is exposed,
wherein the part of the top surface of the first gate electrode is positioned higher than a part of a surface of the first insulating layer,
wherein the first gate electrode in a region exposed from the first insulating layer is electrically connected to the second source electrode or the second drain electrode, and
wherein a root-mean-square roughness of a region which is the part of the surface of the second insulating layer and is in contact with the second channel formation region is less than or equal to 1 nm.

16. The semiconductor device according to claim 15,
wherein a part of a side surface of the first gate electrode is exposed.

17. The semiconductor device according to claim 15,
wherein the first channel formation region and the second channel formation region comprise different semiconductor materials.

* * * * *